(12) United States Patent
Sago et al.

(10) Patent No.: US 9,595,675 B2
(45) Date of Patent: Mar. 14, 2017

(54) LIGHT EMITTING ELEMENT WITH IMPROVED LAYER THICKNESS UNIFORMITY

(71) Applicant: SEIKO EPSON CORPORATION, Tokyo (JP)

(72) Inventors: Takumi Sago, Matsumoto (JP); Masahiro Uchida, Chino (JP); Kohei Ishida, Suwa (JP); Shotaro Watanabe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/666,936

(22) Filed: Mar. 24, 2015

(65) Prior Publication Data

US 2015/0280130 A1 Oct. 1, 2015

(30) Foreign Application Priority Data

Mar. 27, 2014 (JP) .................. 2014-067151

(51) Int. Cl.
*H01L 51/56* (2006.01)
*H01L 51/00* (2006.01)
*H01L 51/52* (2006.01)
*H01L 51/50* (2006.01)
*H01L 27/32* (2006.01)

(52) U.S. Cl.
CPC ...... *H01L 51/0005* (2013.01); *H01L 51/5056* (2013.01); *H01L 27/3246* (2013.01); *H01L 51/5012* (2013.01); *H01L 51/5072* (2013.01); *H01L 51/5088* (2013.01); *H01L 51/5092* (2013.01)

(58) Field of Classification Search
CPC . H01L 51/0005; H01L 51/56; H01L 51/0021; H01L 51/5056; H01L 51/5225; H01L 33/36; H01L 33/48; H01L 51/5088; H01L 51/5012
See application file for complete search history.

(56) References Cited

U.S. PATENT DOCUMENTS 7,656,084 B2 * 2/2010 Ishida ................. H01L 51/5278
313/504
2011/0101888 A1 * 5/2011 Uchida ............... H01L 27/3246
315/312

FOREIGN PATENT DOCUMENTS

| JP | 2004-327357 A | 11/2004 |
|---|---|---|
| JP | 2006-088003 A | 4/2006 |
| JP | 2008-218250 A | 9/2008 |
| JP | 2011-008936 A | 1/2011 |
| JP | 2011-029666 A | 2/2011 |

(Continued)

*Primary Examiner* — Thomas L Dickey
*Assistant Examiner* — Damon Hillman
(74) *Attorney, Agent, or Firm* — Oliff PLC

(57) ABSTRACT

A light-emitting element includes an anode, a cathode, a hole transporting layer provided between the anode and cathode, a light-emitting layer provided in contact with the hole transporting layer between the anode and cathode, where the surface of the light-emitting layer side of the hole transporting layer is formed in a shape having a part in which the distance with the reference surface along the anode changes in a continuous or step-wise manner, and the surface of the opposite side to the hole transporting layer of the light-emitting layer is formed so as to have the same shape as the surface of the light-emitting layer of the hole transporting layer.

14 Claims, 15 Drawing Sheets

(56) References Cited

FOREIGN PATENT DOCUMENTS

| | | |
|---|---|---|
| JP | 2011-249274 A | 12/2011 |
| JP | 2012-028180 A | 2/2012 |
| JP | 2012-216810 A | 11/2012 |
| JP | 2013-171765 A | 9/2013 |

\* cited by examiner

← LONG AXIS DIRECTION
(LENGTH DIRECTION)

FIG. 5A    DRYING-HARDENING
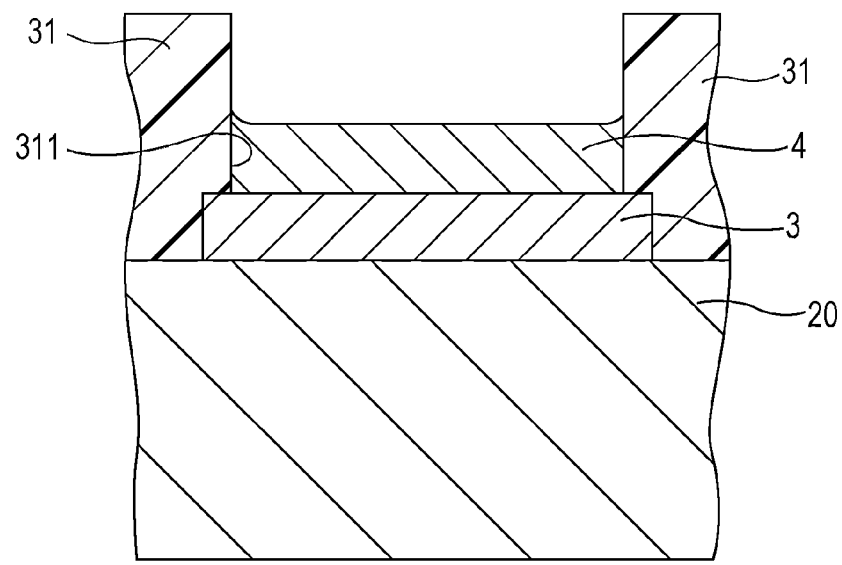
FIG. 5B
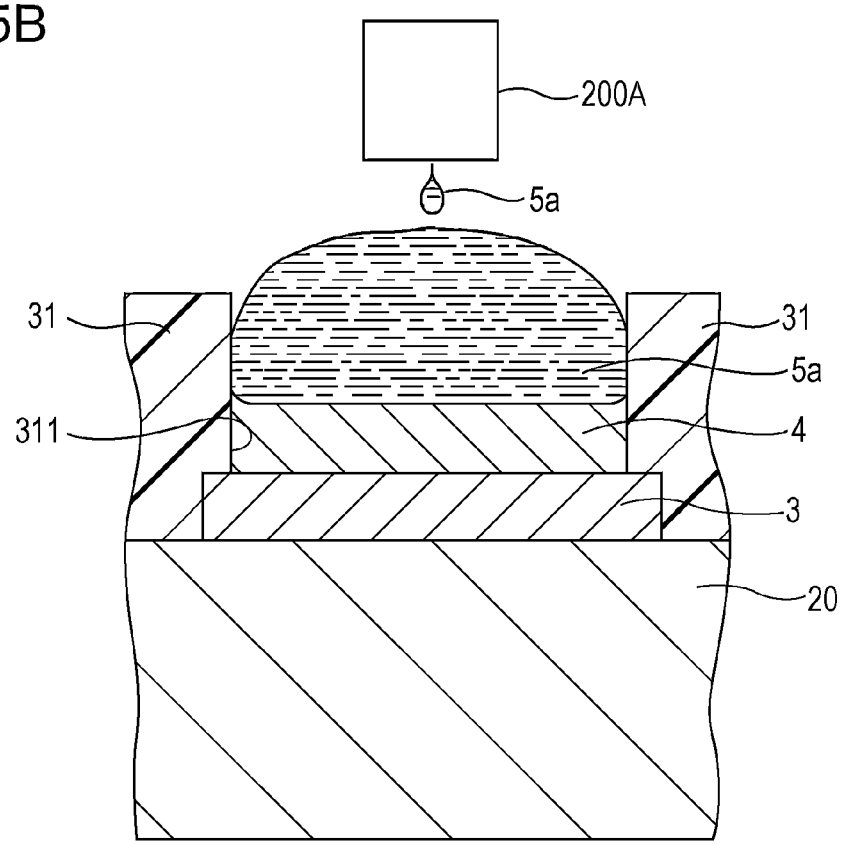

DRYING-HARDENING

DRYING-HARDENING

EXAMPLE 1

EXAMPLE 1

STATE AFTER HIL FORMATION, BEFORE HTL FORMATION

WET EXPANSE POSITION OF EML INK DROPPED
AFTER HTL FORMATION
EXAMPLE 1

WET EXPANSE POSITION OF EML INK DROPPED
AFTER HTL FORMATION
COMPARATIVE EXAMPLE

COMPARATIVE EXAMPLE

COMPARATIVE EXAMPLE

LIGHT EMITTING ELEMENT WITH IMPROVED LAYER THICKNESS UNIFORMITY

BACKGROUND

1. Technical Field

The present invention relates to a light-emitting element, a method of manufacturing a light-emitting element, a light-emitting device and an electronic apparatus.

2. Related Art

An organic electroluminescent device (a so-called organic EL element) is a light-emitting element having a structure in which at least one luminescent organic layer (light-emitting layer) is interposed between an anode and a cathode. In such a light-emitting element, by applying an electric field between the cathode and the anode, electrons are injected from the cathode side into the light-emitting layer and holes are injected from the anode side, excitons are generated by the recombination of the electrons and the holes in the light-emitting layer, and, when the excitons return to a ground state, the energy portion thereof is released as light.

A method for forming a light-emitting layer using a liquid phase process such as an ink jet method (for example, JP-A-2011-29666) is known as a method of manufacturing of such an organic EL element. For example, in JP-A-2011-29666, after forming the hole injection layer using an ink jet method in a bank provided on the substrate, a light-emitting layer is formed using an ink jet method on the hole injection layer. In JP-A-2011-29666, the flatness of the light-emitting layer is increased.

However, because the thickness of the outer peripheral portion of the hole injection layer that is the underlayer of the light-emitting layer becomes thicker than the central portion, even if the thickness of the light-emitting layer formed thereafter is simply made uniform, it is difficult to uniformize the substantial thickness of the light-emitting layer, and a problem arises of the brightness distribution of the emitted light becoming non-uniform as a result.

SUMMARY

An advantage of some aspects of the invention is to provide a light-emitting element having excellent light-emitting characteristics and a method of manufacturing thereof even if the manufacturing uses a liquid phase process, and to provide a light-emitting device and electronic apparatus provided with the light-emitting element.

The invention can be realized in the following forms or application examples.

Application Example 1

According to this application example, there is provided a light-emitting element, including a first electrode; a second electrode; a first layer provided between the first electrode and the second electrode; and a second layer provided in contact with the first layer between the first layer and the second electrode, in which a surface of the second layer side of the first layer is formed having a part in which the distance with a reference surface along the first electrode changes in a continuous or step-wise manner, and a surface of the opposite side to the first layer of the second layer is formed so as to have the same shape as a surface of the second layer surface of the first layer.

In this case, even in a case in which the thickness of the outer peripheral portion of the first layer becomes thicker than the central portion, the substantial film thickness of the second layer can be made uniform. In so doing, even in manufacturing using a liquid phase process, a light-emitting element having excellent light-emitting characteristics can be provided.

Application Example 2

In the light-emitting element of the application example, it is preferable that, in a predetermined range in the width direction of the second layer, the difference between the distance between the surface of the second layer side of the first layer and the reference surface and the distance between the surface of the opposite side to the first layer of the second layer and the reference surface becomes fixed.

In this case, the film thickness of the second layer can be substantially uniformized.

Application Example 3

In the light-emitting element of the application example, it is preferable that the difference in 90% or more in the width range with respect to the entire width of the second layer is within a range of ±10% or less with respect to the average value thereof.

In this case, the film thickness of the second layer can be substantially uniformized.

Application Example 4

In the light-emitting element of the application example, it is preferable that the second layer has a long shape when viewed in the direction in which the first electrode and the second electrode overlap, and the difference in 90% or more in the width range with respect to the entire width in the length direction of the second layer is within a range of ±10% or less with respect to the average value thereof.

In this case, the film thickness of the second layer can be substantially uniformized.

Application Example 5

In the light-emitting element of the application example, it is preferable that the first electrode is an anode, the second electrode is a cathode, the first layer is an electron injection layer or an electron transporting layer, and the second layer is a light-emitting layer.

In this case, the substantial film thickness of the light-emitting layer can be made uniform. As a result, the brightness distribution of emitted light can be uniformized.

Application Example 6

According to this application example, there is provided a method of manufacturing a light-emitting element, including forming a first electrode; forming a first layer using a liquid phase process on one surface side of the first electrode; forming a second layer using a liquid phase process on the first layer; and forming a second electrode on an opposite side to the first layer of the second layer, in which the forming of the second layer is performed so that the surface of the opposite side to the first layer of the second layer and the surface of the second layer side of the first layer have the same shape.

According to the method of manufacturing a light-emitting element of this application example, the substantial film thickness of the second layer can be made uniform. In so doing, the characteristics of the light-emitting element can be increased.

Application Example 7

In the method of manufacturing a light-emitting element of the application example, it is preferable that the first layer and the second layer be formed in the same divided bank.

In this case, the thickness of the outer peripheral portion of the first layer easily becomes thicker than the central portion, and the thickness of the outer peripheral portion of the second layer formed thereafter also easily becomes thicker than the central portion. Because the substantial thickness of the second layer is influenced by the shape of the surface of the second layer side of the first layer, and the thickness of the outer peripheral portion becomes thicker than the central portion even if the thickness of the second layer is simply made uniform. Accordingly, in such a case, when the invention is applied, the results are remarkably exhibited.

Application Example 8

In the method of manufacturing a light-emitting element according to the application example, it is preferable that the forming of the second layer is performed by fixing after applying a liquid including a material that configures the second layer or a precursor thereof on the first layer, and, in the forming of the second layer, a contact angle of the precursor with respect to the first layer is the same as or smaller than the contact angle of the precursor with respect to the bank.

In this case, the thickness of the outer peripheral portion of the second layer becoming thicker than the central portion can be reduced. As a result, in a case in which the thickness of the outer peripheral portion of the first layer becomes thicker, the substantial film thickness of the second layer can be made uniform.

Application Example 9

In the method of manufacturing a light-emitting element of the application example, it is preferable that B/A is 0.003 ng/$\mu$m$^2$ or more and 0.006 ng/$\mu$m$^2$ or less when the area in plan view in the bank is A[$\mu$m$^2$] and the amount of the liquid applied on the first layer when forming the second layer is B[ng].

In this case, the thickness of the outer peripheral portion of the second layer becoming thicker than the central portion can be effectively reduced.

Application Example 10

In the method of manufacturing a light-emitting element of the application example, it is preferable that, it is preferable that drying is performed by reducing pressure from normal pressure to 5 Pa within 5 minutes after applying the precursor on the first layer.

In this case, the thickness of the outer peripheral portion of the second layer becoming thicker than the central portion can be effectively reduced.

Application Example 11

According to this application example, there is provided a light-emitting device provided with a light-emitting element according to the application examples.

In this case, a light-emitting device that includes a light-emitting element having excellent light-emitting characteristics can be provided.

Application Example 12

According to this application example, there is provided an electronic apparatus that includes the light-emitting element according to the application examples.

In this case, an electronic apparatus that includes a light-emitting element having excellent light-emitting characteristics can be provided.

BRIEF DESCRIPTION OF THE DRAWINGS

The invention will be described with reference to the accompanying drawings, wherein like numbers reference like elements.

FIGS. 5A and 5B are diagrams for illustrating the method of manufacturing a light-emitting element shown in FIG. 2A.

FIG. 12A shows a state after forming the hole injection layer and before forming the hole transporting layer, FIG. 12B shows a state after dropping the ink for light-emitting layer formation of Example 1, and FIG. 12C shows a state after dropping the ink for light-emitting layer formation of a comparative example.

DESCRIPTION OF EXEMPLARY EMBODIMENTS

Figure 1:
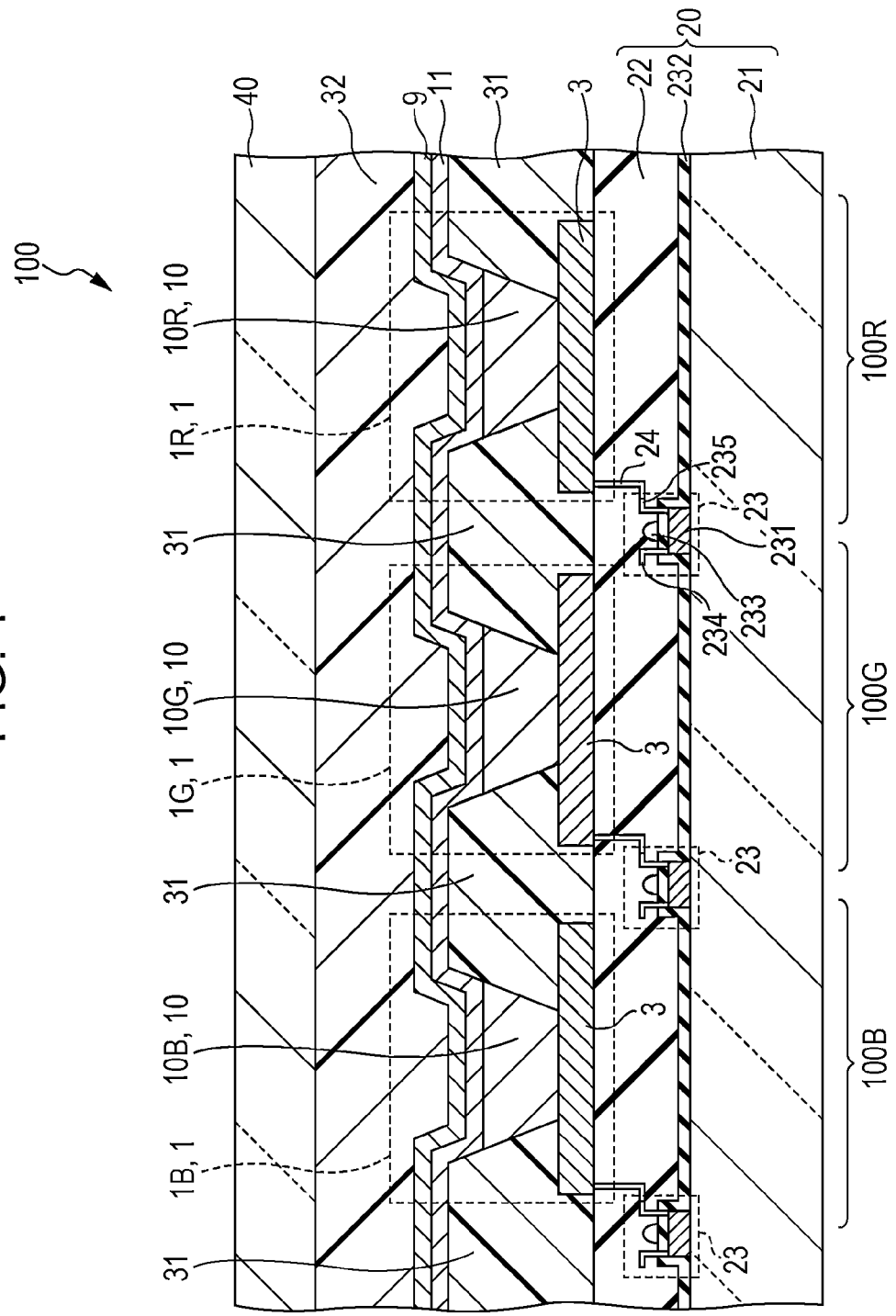
FIG. 1 is a cross-sectional view showing a light-emitting device (display device) according to an embodiment of the invention.

Below, the light-emitting element, the method of manufacturing a light-emitting element, the light-emitting device, and the electronic apparatus of the invention will be described based on suitable embodiments shown in the drawings. For convenience of description, in each drawing, the scale of each portion is modified as appropriate, and the configuration in the drawings does not necessarily match the scale in practice.

(Light-Emitting Device)

A display device that is an example of the light-emitting device of the invention will be described.

FIG. 1 is a cross-sectional view showing the light-emitting device (display device) according to an embodiment of the invention. Below, for convenience of description, description is provided with the upper side in FIG. 1 as "up" and the lower side as "down".

The display device 100 shown in FIG. 1 is provided with a plurality of light-emitting elements 1R, 1G, and 1B corresponding sub-pixels 100R, 100G, and 100B, thereby configuring a display panel with a bottom emission structure. In the embodiment, an example is described in which an active matrix method is employed as the driving method of the display device, a passive matrix method is also preferably employed.

The display device 100 includes a circuit substrate 20, a plurality of light-emitting elements 1R, 1G, and 1B provided on the circuit substrate 20, and a sealing substrate 40.

The circuit substrate 20 includes a substrate 21, an interlayer insulating film 22 provided on the substrate 21, and a plurality of switching elements 23 and wirings 24.

The substrate 21 is a substantially transparent (colorless and transparent, colored and transparent or semi-transparent). In so doing, it is possible for light from each of the light-emitting elements 1R, 1G, and 1B to be extracted from the substrate 21 side. Examples of the constituent materials of the substrate 21 include resin materials such as polyethylene terephthalate, polyethylene naphthalate, polypropylene, cycloolefin polymer, polyamide, polyether sulfone, polymethyl methacrylate, polycarbonate, and polyarylate; glass materials such as quartz glass and soda glass; and the like, and it is possible to use one type or a combination of two or more types from the above.

In the case of a top-emission structure that extracts light from the light-emitting elements 1R, 1G, and 1B from the opposite side to the substrate 21, the substrate 21 is preferably an opaque substrate, and examples of this opaque substrate include a substrate configured by ceramic material such as alumina, those in which an oxide film (insulating film) is formed on the surface of a metal substrate, such as stainless steel, and substrates configured of resin materials.

A plurality of switching elements 23 is arranged in a matrix form on such a substrate 21. Each switching element 23 is provided corresponding to each light-emitting element 1R, 1G, and 1B, and is a driving transistor for driving each light-emitting element 1R, 1G, and 1B.

Each switching element 23 includes a semiconductor layer 231 formed from silicon, a gate insulating layer 232 formed on the semiconductor layer 231, a gate electrode 233 formed on the gate insulating layer 232, a source electrode 234, and a drain electrode 235.

An interlayer insulating film 22 configured by an insulating material is formed so as to cover the plurality of switching elements 23. A wiring 24 is provided on the interlayer insulating film 22.

On the interlayer insulating film 22, the light-emitting elements 1R, 1G, and 1B are provided corresponding to each switching element 23. In the light-emitting element 1R, an anode 3 (first electrode), stacked bodies 10 (10R), 11, and a cathode 9 (second electrode) are stacked in this order on the interlayer insulating film 22. In the embodiment, the anode 3 of each light-emitting element 1R, 1G, and 1B configures the pixel electrode, and is electrically connected to the drain electrode 235 of each switching element 23 via the wiring 24. The cathode 9 of the light-emitting element 1R is a common electrode with the cathode 9 of the light-emitting elements 1G and 1B. The stacked body 11 of the light-emitting element 1R is shared with the light-emitting elements 1G and 1B.

It is possible for the configuration of the light-emitting elements 1G and 1B to each be configured similarly to the light-emitting element 1R. Here, by making the stacked bodies 10R, 10G, and 10B (in particular, the light-emitting layers) of the light-emitting elements 1R, 1G, and 1B different to one another, it is possible for different colors of light to be emitted. For example, the light-emitting element 1R emits red light, the light-emitting element 1G emits green light, and the light-emitting element 1B emits blue light.

A dividing wall 31 (bank) is provided between each of the neighboring light-emitting elements 1R, 1G, and 1B. The light-emitting elements 1R, 1G, and 1B are bonded to the sealing substrate 40 via a resin layer 32 configured by a thermosetting resin such as an epoxy resin.

Because each of the light-emitting elements 1R, 1G, and 1B of the above-described embodiment is a bottom emission types, the sealing substrate 40 is preferably a transparent substrate or an opaque substrate, and it is possible to use the same material as the above-described substrate 21 as the constituent materials of the sealing substrate 40.

Light-Emitting Element

The light-emitting elements 1R, 1G, and 1B will be described in detail.

Figure 2A:
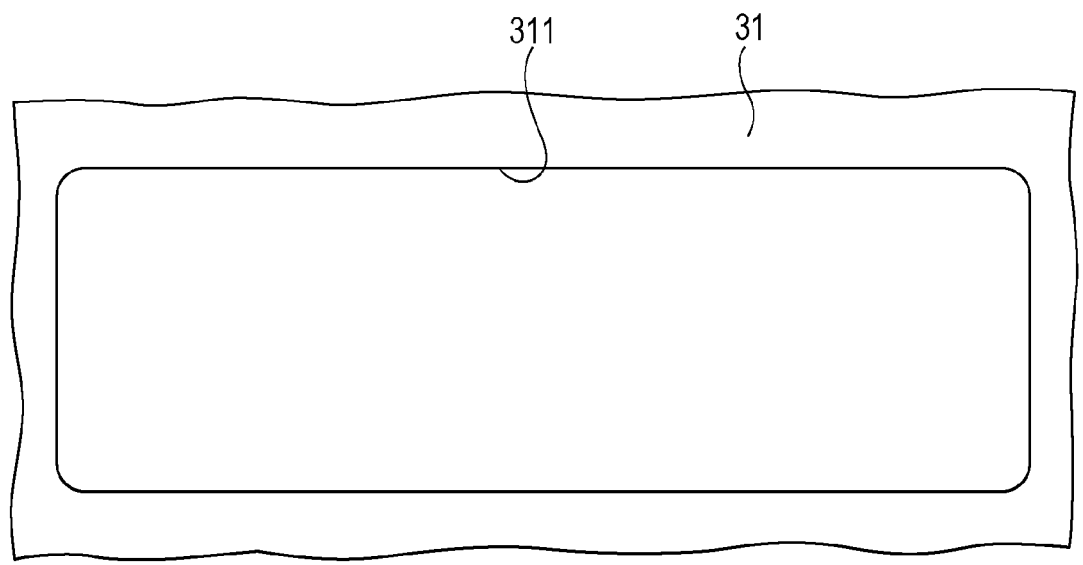
FIG. 2A is a plan view of a bank included in the light-emitting device shown in FIG. 1
Figure 2B:
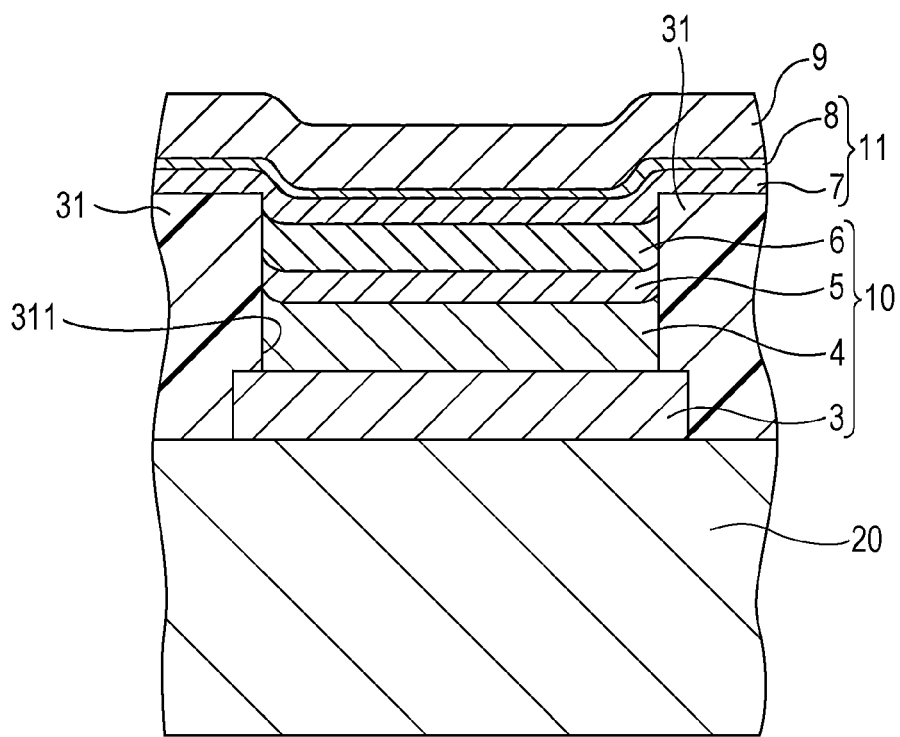
FIG. 2B is a cross-sectional view of a light-emitting element included in the light-emitting device shown in FIG. 1.

FIG. 2A is a plan view of the bank included in the light-emitting device shown in FIG. 1, and FIG. 2B is a cross-sectional view of the light-emitting element included in the light-emitting device shown in FIG. 1.

The light-emitting element (electroluminescence element) 1 shown in FIG. 2 is configured by the above-described light-emitting elements 1R, 1G, and 1B, and, as described above, stacked bodies 10 and 11 are interposed between the anode 3 (first electrode) and the cathode 9 (second electrode). In the stacked body 10, as shown in FIG. 2, the hole injection layer 4, the hole transporting layer 5 (first layer) and the light-emitting layer 6 (second layer) are stacked in this order from the anode 3 side to the cathode 9 side. In the stacked body 11, the electron transporting layer 7 and the electron injection layer 8 are stacked in this order form the anode 3 side to the cathode 9 side.

In other words, in the light-emitting element 1, the hole injection layer 4, the hole transporting layer 5, the light-emitting layer 6, the electron transporting layer 7, and the electron injection layer 8 are stacked in this order between the anode 3 and the cathode 9, from the anode 3 side to the cathode 9 side.

In such a light-emitting element 1, along with electrons being supplied (injected) from the cathode 9 side with respect to the light-emitting layer 6, holes are supplied (injected) from the anode 3 side. In the light-emitting layer 6, the holes and the electrons are recombined, excitons are generated by the energy released during the recombination, and energy (fluorescence and phosphorescence) is released (light emission) when the excitons return to the ground state.

Below, the configuration of each portion of the light-emitting element 1 will be simply described.

Anode

The anode 3 is an electrode that injects holes into the hole transporting layer 5 through the hole injection layer 4. As constituent materials of the anode 3, it is preferable to use materials having a high work function and having excellent conductivity.

Examples of the constituent material of the anode 3 include oxides such as Indium Tin Oxide (ITO), Indium Zinc Oxide (IZO), $In_3O_3$, $SnO_2$, $SnO_2$ containing Sb, oxides such as ZnO containing Al, and Au, Pt, Ag, and Cu or alloys including these, and it is possible to use one type or a combination of two or more types from the above.

Cathode

Meanwhile, the cathode 9 is an electrode that injects electrons into the electron transporting layer 7 via the electron injection layer 8. It is preferable to use material with a low work function as the constituent material of the cathode 9.

Examples of the constituent material of the cathode 9 include Li, Mg, Ca, Sr, La, Ce, Er, Eu, Sc, Y, Yb, Ag, Cu, Al, Cs, and Rb or alloys including these, it is possible to use one type or a combination (for example, a stacked body with a plurality of layers, or the like) of two or more types from the above.

In particular, in a case of using an alloy as the constituent material of the cathode 9, it is preferable to use an alloy including stable metal elements such as Ag, Al, and Cu, specifically, alloys such as MgAg, AlLi, and CuLi. By using the above alloys as the constituent material of the cathode 9, it is possible to achieve an increase in the electron injection efficiency and stability properties of the cathode 9.

Since the light-emitting element 1 of the embodiment is a bottom emission type, the cathode 9 preferably does not have optical transparency.

Hole Injection Layer

The hole injection layer 4 has a function of improving the hole injection efficiency from the anode 3.

The constituent material (hole injection material) of the hole injection layer 4 is not particularly limited, and examples thereof include conductive polymer materials such as polythiophone based hole injection materials such as poly (3,4-ethylenedioxythiophene)-poly(styrene sulfonic acid) (PEDOT/PSS), polyaniline based hole injection materials such as polyaniline-poly(styrene sulfonic acid) (PANI/PSS), TAPC ((1,1-bis[4-(di-p-tolyl)amino phenyl]cyclohexane)): 4,4'-Cyclohexylidenebis[N,N-bis(4-methylphenyl)aniline]), TPD (N,N'-diphenyl-N,N'-bis-(3-methylphenyl)-1,1' biphenyl-4,4'-diamine), α-NPD (N,N'-diphenyl-N,N'-bis-(1-naphthyl)-1,1'-biphenyl-4,4'-diamine), m-MTDATA, 4,4', 4"-tris(N-3-methylphenylamino)-triphenylamine: 4,4',4"-Tris(N-3-methylphenyl-N-phenylamino)-triphenylamine), 2-TNATA (4,4',4"-tris(N,N-(2-naphthyl)phenylamino)triphenylamine), TCTA (4,4',4"-tri(N-carbazole group)triphenylamine: Tris-(4-carbazoyl-9-yl-phenyl)-amine), TDAPB (1,3,5-tris-(N,N-bis-(4-methoxy-phenyl)-aminophenyl)-benzene: 1,3,5-tris[4-(diphenylamino)phenyl]benzene), spiro-TAD, HTM1 (Tri-p-tolylamine HTM2,1,1-bis[(di-4-tolylamino)phenyl]cyclohexane), HTM2 (1,1-bis[(di-4-tolylamino)phenyl]cyclohexane), TPT1 (1,3,5-tris(4-pyridyl)-2,4,6-triazin), and TPTE (Triphenylamine-tetramer), and it is possible to use one type or a combination of two or more types from the above.

Although the average thickness of the above hole injection layer 4 is not particularly limited, approximately 5 nm to 150 nm is preferable and approximately 10 nm to 100 nm is more preferable.

Hole Transporting Layer

The hole transporting layer 5 has a function of transporting injected holes from the anode 3 via the hole injection layer 4 to the light-emitting layer 6.

The constituent material of the hole transporting layer 5 is not particularly limited, and examples thereof include amine based compounds such as TFB (poly(9,9-dioctyl-fluorene-co-N-(4-butylphenyl)-diphenylamine)), and polymer organic material based on polysilane or the like including polyfluorene derivatives (PF) or polyparaphenylenevinylene derivatives (PPV), polyparaphenylene derivatives (PPP), polyvinylcarbazole (PVK), polythiophene derivatives, or poly methyl phenyl silane (PMPS), and it is possible to use one type or a combination of two or more types from the above. It is possible for the above-described constituent materials for the hole injection layer 4 to be used as the constituent material for the hole transporting layer 5.

Although the average thickness of the above hole transporting layer 5 is not particularly limited, approximately 10 nm to 150 nm is preferable and approximately 10 nm to 100 nm is more preferable.

It is possible for hole transporting layer 5 to not be included. In this case, the hole injection layer 4 also serves the function of the hole transporting layer 5.

Light-Emitting Layer

The light-emitting layer 6 is provided in contact with the hole transporting layer 5. The light-emitting layer 6 is configured to include a light-emitting material.

The above red light-emitting material is not particularly limited, and it is possible to use one type or combine two or more types of various fluorescent material and phosphorescent materials. In a case of using the light-emitting element 1 as the above-described light-emitting element 1R, a red light fluorescent material or a red phosphorescent material is used as the light-emitting material, in the case of using the light-emitting element 1 as the above-described light-emitting element 1G, a green fluorescent material or a green phosphorescent material is used as the light-emitting material, and in a case of using the light-emitting element 1 as the light-emitting element 1B, a blue fluorescent material or a blue phosphorescent is used as the light-emitting material.

The red fluorescent material is not particularly limited as long as it generates red fluorescent light and examples thereof include perylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizine-9-yl)ethenyl)-4H-pyran- 4H-ylidene)propanedinitrile(DCJTB), and 4-(dicyanomethylene)-2-methyl-6-(p-dimethylaminostyryl)-4H-pyran (DCM).

The red phosphorescent material is not particularly limited as long as it generates red phosphorescence and examples thereof include metal complexes of iridium, ruthenium, platinum, osmium, rhenium, and palladium, and further examples thereof include those in which at least one in the ligands of the above metal complexes has a phenyl pyridine skeleton, a bipyridyl skeleton, a porphyrin skeleton, or the like. More specifically, examples thereof include tris(1-phenylisoquinoline)iridium, bis[2-(2'-benzo[4,5-α]thienyl)pyridinate-N,$C^{3'}$]iridium(acetylacetonate)(btp2Ir (acac)), 2,3,7,8,12,13,17,18-octaethyl-12H,23H-porphyrin-platinum (II), bis[2-(2'-benzo[4,5-α]thienyl) pyridinate-N, $C^{3'}$]iridium, and bis(2-phenylpyridine)iridium (acetylacetonate).

The green fluorescent material is not particularly limited as long as it generates green fluorescence and examples thereof include coumarin derivatives, quinacridone and derivatives thereof such as quinacridone derivatives, 9,10-bis[(9-ethyl-3-carbazole)-vinylene]-anthracene, poly(9,9-dihexyl-2,7-vinylenefluorolenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorolenylene)-ortho-co-(2-methoxy-5-(2-ethoxyhexyloxy)-1,4-phenylene)].

The green phosphorescent material is not particularly limited as long as it generates green phosphorescence and examples thereof include metal complexes of iridium, ruthenium, platinum, osmium, rhenium, palladium, and the like, and specific examples thereof include fac-tris(2-phenylpyridine) iridium (Ir(ppy)3), bis(2-phenyl pyridinate-N,$C^{2'}$)iridium(acetylacetonate), and fac-tris[5-fluoro-2-(5-trifluoromethyl-2-pyridine)phenyl-C,N]iridium.

The blue fluorescent material is not particularly limited as long as it generates a blue fluorescence and examples thereof include styrylamine derivatives such as styrylamine compounds, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9.9-dioctylfluorene-2,7-diyl)-co-(2,5-dimethoxybenzene-1,4-diyl)], poly[(9,9-oxydihexylfluorene-2,7-diyl)-ortho-co-(2-methoxy-5-{2-ethoxyhexyloxy}phenylene-1,4-diyl)], and poly[(9,9-dioctylfluorene-2,7-diyl)-co-(ethyl benzene)].

The blue phosphorescent material is not particularly limited as long as it generates blue phosphorescence and examples thereof include metal complexes of iridium, ruthenium, platinum, osmium, rhenium, palladium and the like, and specific examples include bis[4,6-difluorophenyl pyridinate-N,$C^{2'}$]-picolinate-iridium, tris[2-(2,4-difluorophenyl) pyridinate-N,$C^{2'}$]iridium, bis[2-(3,5-trifluoromethyl)pyridinate-N,$C^{2'}$]-picolinate-iridium, and bis(4,6-difluorophenyl pyridinate-N,$C^{2'}$)iridium (acetylacetonate).

One type of the light-emitting material may be used individually, or two or more types may be used together.

In addition to the above-described light-emitting material, a host material to which the light-emitting material is added as the guest material is preferably included in the light-emitting layer 6. The host material generates excitons by recombining the holes and electrons, and, along with this, has a function of transferring the energy of the excitons to the light-emitting material (Forster transfer or Dexter transfer), thereby exciting the light-emitting material. In a case of using the host material, it is possible to use the host material by doping the host material with a light-emitting material, which is a guest material, as the dopant.

The host material is not particularly limited as long as the above-described function is exhibited with respect to the light-emitting material used, and examples thereof include naphthacene derivatives, napthalene derivatives, acene derivatives (acene based materials) such as anthracene derivatives, distyrylarylene derivatives, perylene derivatives, distyryl benzene derivatives, distyrylamine derivatives, quinolinolate metal complexes such as tris(8-quinolinolato) aluminum complex ($Alq_3$), triarylamine derivatives such as tetramers of triphenylamine, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBI), and it is possible to use one type singly or a combination of two or more types from the above.

In a case of using the above-described light-emitting material (guest material) and host material, it is preferable that the content (doping amount) of the light-emitting material in the light-emitting layer 6 be 0.01 wt % to 10 wt % and 0.1 wt % to 5 wt % is more preferable. By making the content of the light-emitting material be within this range, it is possible to optimize the light emission efficiency.

Although the average thickness of the light-emitting layer 6 is not particularly limited, approximately 10 nm to 150 nm is preferable and 10 nm to 100 nm is more preferable. The light-emitting layer 6 is preferably configured by a plurality of stacked light-emitting layers, and, in this case, an intermediate layer that does not emit light is preferably interposed between arbitrary light-emitting layers.

Electron Transporting Layer

The electron transporting layer 7 has a function of transporting injected electrons from the cathode 9 via the electron injection layer 8 to the light-emitting layer 6.

Examples of the constituent material (electron transporting material) of the electron transporting layer 7 include quinoline derivatives such as organic metal complexes having 8-quinolinol, such as tris(8-quinolinolato) aluminum ($Alq_3$) or derivatives thereof as ligand, oxadiazole derivatives, perylene derivative, pyridine derivatives, pyrimidine derivatives, quinoxaline derivatives, diphenyl quinone derivatives, and nitro-substituted fluorene derivatives, and it is possible to use one type or a combination of two or more types from the above.

Although the average thickness of the electron transporting layer 7 is not particularly limited, approximately 0.5 to 100 nm is preferable and 1 to 50 nm is more preferable.

It is possible for the electron transporting layer 7 to not be included.

Electron Injection Layer

The electron injection layer 8 has a function of improving the electron injection efficiency from the cathode 9.

Examples of the constituent material (electron injection material) of the electron injection layer 8 include, for example, various inorganic insulating materials and various inorganic semiconductor materials.

Examples of the inorganic insulating material include alkali metal chalcogenides (oxides, sulfides, selenides, tellurides), alkaline earth metal chalcogenides, and alkali metal halides and alkaline earth metal halides, and it is possible to use one type or a combination of two or more types from the above. By configuring the electron injection layer with the above as the main material, it is possible to further improve the electron injection properties. In particular, alkali metal compounds (alkali metal chalcogenides, alkali metal halides, and the like) have an extremely low work function, and, by using these to configure the electron injection layer 8, the light-emitting element 1 is able to obtain a high brightness.

Examples of the alkali metal chalcogenides include $Li_2O$, LiO, $Na_2S$, $Na_2Se$, and NaO. Examples of the alkaline earth metal chalcogenides include CaO, BaO, SrO, BeO, BaS, MgO, and CaSe. Examples of the alkali metal halides include CsF, LiF, NaF, KF, LiCl, KCl, and NaCl. Examples of the alkaline earth metal halides include $CaF_2$, $BaF_2$, $SrF_2$, $MgF_2$, and $BeF_2$.

Examples of the inorganic semiconductor material include oxides including at least one element from among Li, Na, Ba, Ca, Sr, Yb, Al, Ga, In, Cd, Mg, Si, Ta, Sb, and Zn; and nitrides or oxynitrides, and it is possible to use one type or a combination of two or more types from the above.

Although the average thickness of the electron injection layer 8 is not particularly limited, approximately 0.1 to 1000 nm is preferable, approximately 0.2 to 100 nm is more preferable, and approximately 0.2 to 50 nm is even more preferable.

It is possible for the electron injection layer 8 to not be included.

Figure 3A:
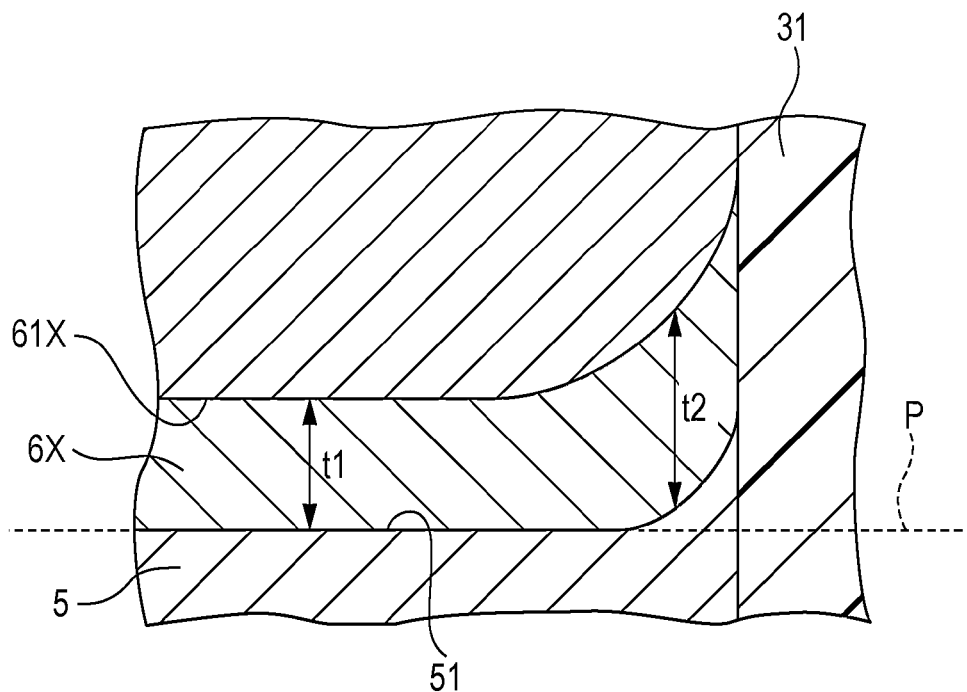
FIG. 3A is a schematic view for illustrating the cross-sectional shape of the light-emitting layer of the light-emitting element of the related art and FIG. 3B is a schematic view for illustrating the cross-sectional shape of the light-emitting layer of the light-emitting element shown in FIG. 2B.
Figure 3B:
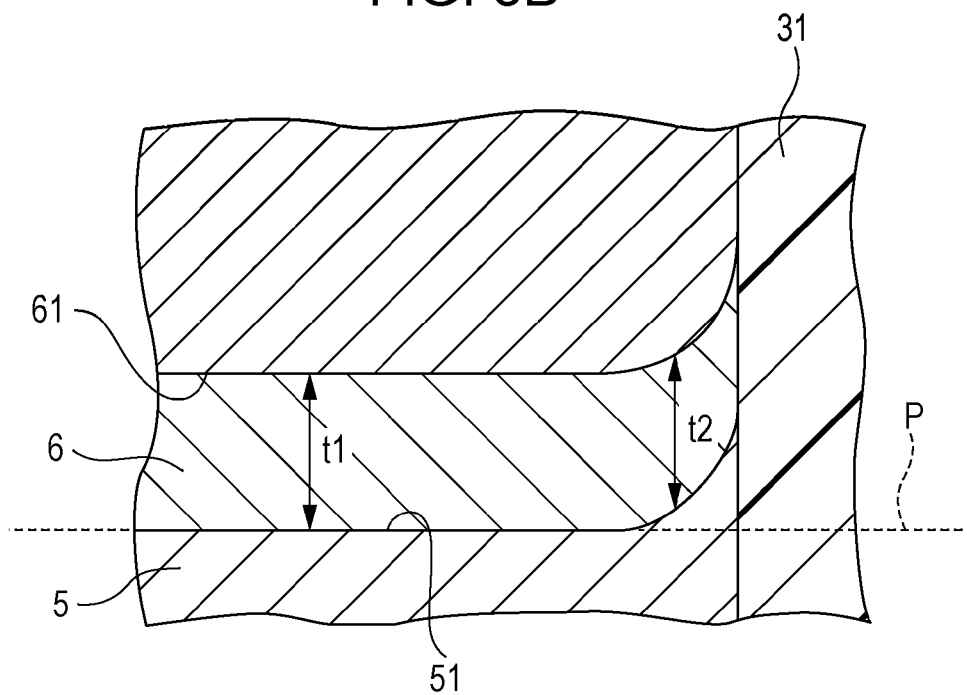

In the light-emitting element 1 configured as above, each layer (hole injection layer 4, hole transporting layer 5, and light-emitting layer 6) of the stacked body 10 is formed using a liquid phase process inside the dividing wall 31 as shown in FIG. 2A. Therefore, the outer peripheral portion of the hole transporting layer 5 easily becomes thicker than the central portion, and, as shown in FIG. 3, the surface 51 on the upper side of the hole transporting layer 5 is formed having a part in which the distance with the reference surface P changes either continuously or in a step-wise manner.

The surface 61X on the opposite side to the hole transporting layer 5 of the light-emitting layer 6X of the related art is different to the surface 51 on the light-emitting layer 6X side of the hole transporting layer 5. Therefore, the substantial thickness t1 of the central portion side of the light-emitting layer 6X and the substantial thickness t2 of the outer peripheral portion side becomes different, and, as a result, a problem arises in which the light emission distribution becomes non-uniform, and the light-emitting region narrows.

In the light-emitting element 1 according to the invention, the surface 61 on the opposite side to the hole transporting layer 5 of the light-emitting layer 6 is formed so as to have the same shape as the surface 51 on the light-emitting layer 6X side of the hole transporting layer 5. That is, the difference (that is, the thicknesses t1 and t2) between the distance between the surface 51 on the light-emitting layer 6 side of the hole transporting layer 5 and the reference surface P and the distance between the surface 61 on the opposite side to the hole transporting layer 5 of the light-emitting layer 6 is formed so as to be fixed. In so doing, it is possible for the substantial thickness t1 of the central portion side of the light-emitting layer 6 and the substantial thickness t2 of the outer peripheral portion side to be made the same, and, as a result, it is possible for the light emission distribution to be uniformized, and for the light-emitting region to spread. The reference surface P is a flat surface along the anode 3, and, in FIG. 3, passes through the central portion of the upper surface of the hole transporting layer 5, and is a flat surface parallel to the anode 3.

The difference is preferably fixed in a predetermined range in the width direction of the light-emitting layer 6, and, specifically, is preferably fixed within a range of 90% or more of the width with respect to the total width of the light-emitting layer 6. The wording "the difference is fixed" indicates that the difference is within a range of ±10% or less with respect to the average value thereof. In so doing, it is possible for the film thickness of the light-emitting layer 6 to be substantially uniformized.

In the embodiment, as shown in FIG. 2A, when viewed from a direction in which the anode 3 and the cathode 9 overlap (that is, in plan view), since inside the dividing wall 31 is formed with a long shape, the light-emitting layer 6 is also formed in a long shape in accordance therewith. It is preferable that the difference in 90% or more in the width range with respect to the entire width in the width direction of the light-emitting layer 6 be within a range of ±10% or less with respect to the average value thereof. In so doing, it is possible for the film thickness of the light-emitting layer 6 to be substantially uniformized.

Because the smaller the area (area of one pixel) in plan view of the inside of the dividing wall 31 becomes, the larger the area occupied by the outer peripheral portion that is thicker than the central portion of the film (such as the hole transporting layer 5) formed by the liquid phase process inside the dividing wall 31 as described above, the above-described problem becomes remarkable. Meanwhile, in recent years, there is demand for the area of one pixel to be reduced along with the increasing definition of a display. Although the length in the length direction (long axis direction) in plan view of the inside of the dividing wall 31 is not particularly limited, approximately 10 μm or more and 1000 μm or less is preferable, and 30 μm or more and 600 μm or less is more preferable. It is preferable that the length in the width direction (short axis direction) in plan view of the inside of the dividing wall 31 be approximately 3 μm or more and 400 μm or less, and 10 μm or more and 200 μm or less is more preferable.

According to the light-emitting element 1 as described above, even in a case in which the thickness of the outer peripheral portion of the hole transporting layer 5 becomes thicker than the central portion, it is possible for the substantial film thickness of the light-emitting layer 6 to be made uniform. In so doing, even in manufacturing using a liquid phase process, it is possible for a light-emitting element 1 having excellent light-emitting characteristics to be provided.

Method of Manufacturing Light-Emitting Element

Next, the method of manufacturing a light-emitting element of the invention will be described with a case of manufacturing the above-described light-emitting element 1 as an example.

FIGS. 4A to 7B are each diagrams for illustrating the method of manufacturing a light-emitting element shown in FIG. 2A.

The method of manufacturing a light-emitting element 1 includes: [1] a step for forming the anode 3, [2] a step for forming the hole injection layer 4, [3] a step for forming the hole transporting layer 5, [4] a step for forming the light-emitting layer 6; and [5] a step for forming the electron transporting layer 7, the electron injection layer 8, and the cathode 9. Below, each step will be sequentially described in detail.

[1]

Figure 4A:
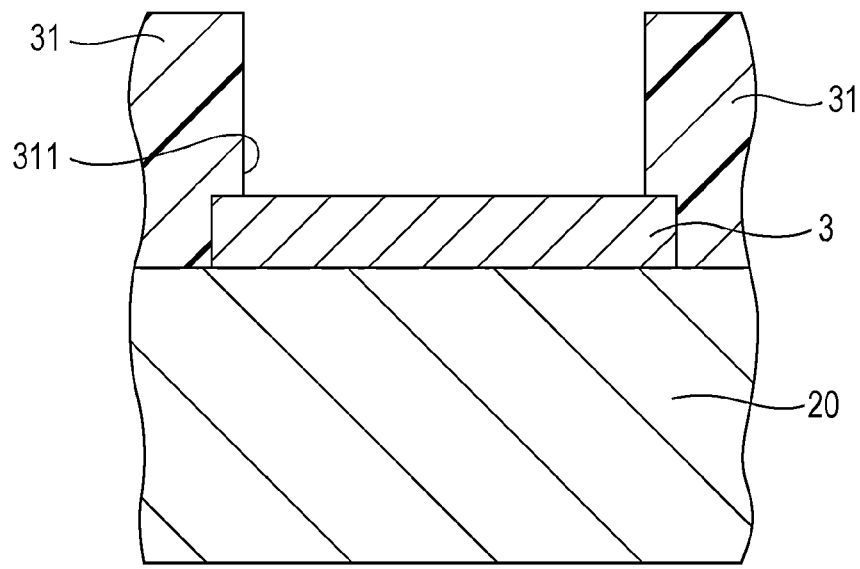
FIGS. 4A and 4B are diagrams for illustrating the method of manufacturing a light-emitting element shown in FIG. 2A.

First, the substrate 21 is prepared, and, after the anode 3 is formed on the substrate 21 as shown in FIG. 4A, a dividing wall 31 is formed.

The anode 3 is obtained by forming the electrode material using a vapor phase film forming method such as a vapor deposition method or CVD method on the substrate 21, then patterning the material using etching or the like.

It is possible to form the dividing wall 31 by patterning or the like using a photolithography method or the like so that the anode 3 is exposed.

The constituent material of the dividing wall 31 is selected taking the heat resistance, liquid repellency, resistance to ink solvency, and adhesiveness to the substrate 21 or the like into consideration. Specifically, examples of the constituent material of the dividing wall 31 include organic materials such as acrylic resins, polyimide resins, and epoxy resins, and inorganic materials such as $SiO_2$.

After formation of the anode 3 and the dividing wall 31, the surfaces of the anode 3 and the dividing wall 31 are preferably subjected to oxygen plasma processing, as necessary. In so doing, it is possible to impart a lyophilic property to the upper surface of the anode 3, remove (wash) organic matter attached to the surface of the anode 3 and the dividing wall 31, and adjust the work function in the vicinity of the upper surface of the anode 3.

As the conditions of the oxygen plasma treatment, it is preferable to set the plasma power to approximately 100 W to 800 W, the oxygen gas flow rate to approximately 50 mL/min to 100 mL/min, the transport speed of the member to be treated (anode 3) to approximately 0.5 mm/sec to 10 mm/sec, and the temperature to the substrate 21 of approximately 70° C. to 90° C.

After the oxygen plasma processing, it is preferable to perform plasma treatment with a fluorine-based gas, such as $CF_4$, as the treatment gas. In so doing, only the surface of the dividing wall 31 formed from a photosensitive resin that is an organic material is made liquid repellent by reacting with fluorine gas. Thereby, it is possible to reduce unintended wetting and spreading of a liquid applied in the dividing wall 31.

[2]

Figure 4B:
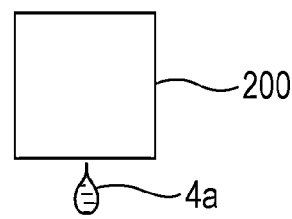
Figure 4B:
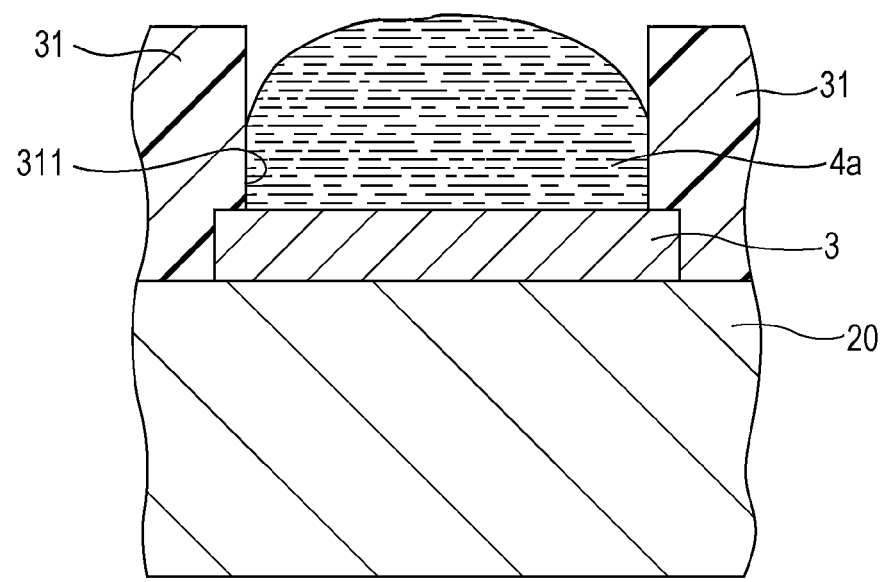

Next, as shown in FIG. 4B, an ink 4*a* for hole injection layer formation is applied on the anode 3 inside the dividing wall 31 from an ink jet head 200.

The ink 4*a* has the constituent material of the hole injection layer 4 or a precursor thereof dissolved in a solvent or dispersed in a dispersion medium. Examples of the solvent or dispersion medium include various inorganic solvents, various organic solvent, or a mixed solvent including these.

Thereafter, as shown in FIG. 5A, the hole injection layer 4 is formed by drying (removing the solvent or removing the dispersion medium) the ink 4*a* on the anode 3 and performing heating, as necessary.

It is possible to perform the drying by leaving to stand at atmospheric pressure or reduced atmospheric pressure, by a heating process, by the spraying of inert gas, or the like.

As above, the hole injection layer 4 is formed with a liquid phase process using the ink 4*a*. The hole injection layer 4 is preferably formed by a vapor phase process, such as a vapor deposition method or a CVD method.

[3]

Next, as shown in FIG. 5B, an ink 5*a* for hole transporting layer formation is applied on the hole injection layer 4 inside the dividing wall 31 from an ink jet head 200A.

The ink 5*a* has the constituent material of the hole transporting layer 5 or a precursor thereof dissolved in a solvent or dispersed in a dispersion medium. Examples of the solvent or dispersion medium include various inorganic solvents, various organic solvent, or a mixed solvent including these.

Figure 6A:
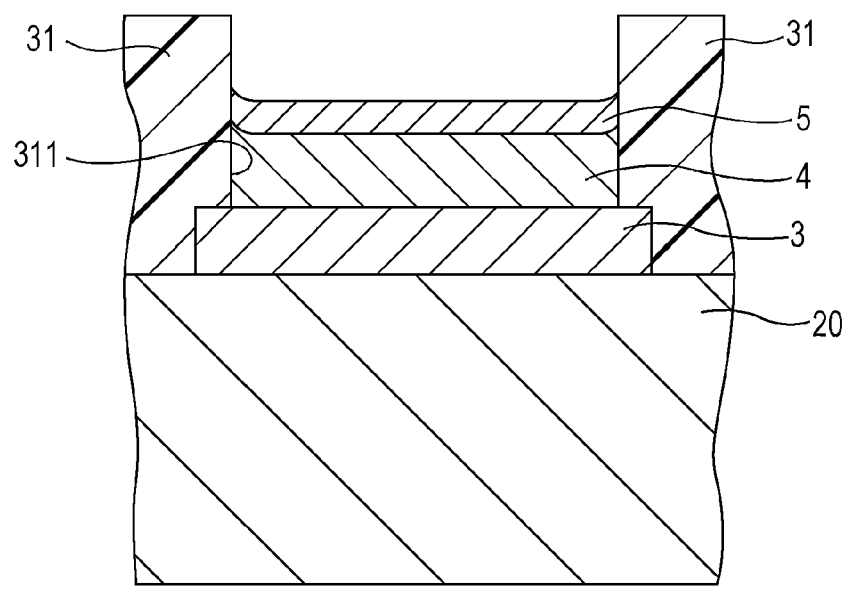
FIGS. 6A and 6B are diagrams for illustrating the method of manufacturing a light-emitting element shown in FIG. 2A.

Thereafter, the hole transporting layer 5 is formed, as shown in FIG. 6A, by drying (removing the solvent or removing the dispersion medium) the ink 5*a* on the hole injection layer 4 and performing heat treating, as necessary.

It is possible to perform the drying by leaving to stand at atmospheric pressure or reduced atmospheric pressure, by a heating process, by the spraying of inert gas, or the like.

As above, the hole transporting layer 5 is formed with a liquid phase process using the ink 5*a*. The hole transporting layer 5 is preferably formed by a vapor phase process, such as a vapor deposition method or a CVD method.

[4]

Figure 6B:
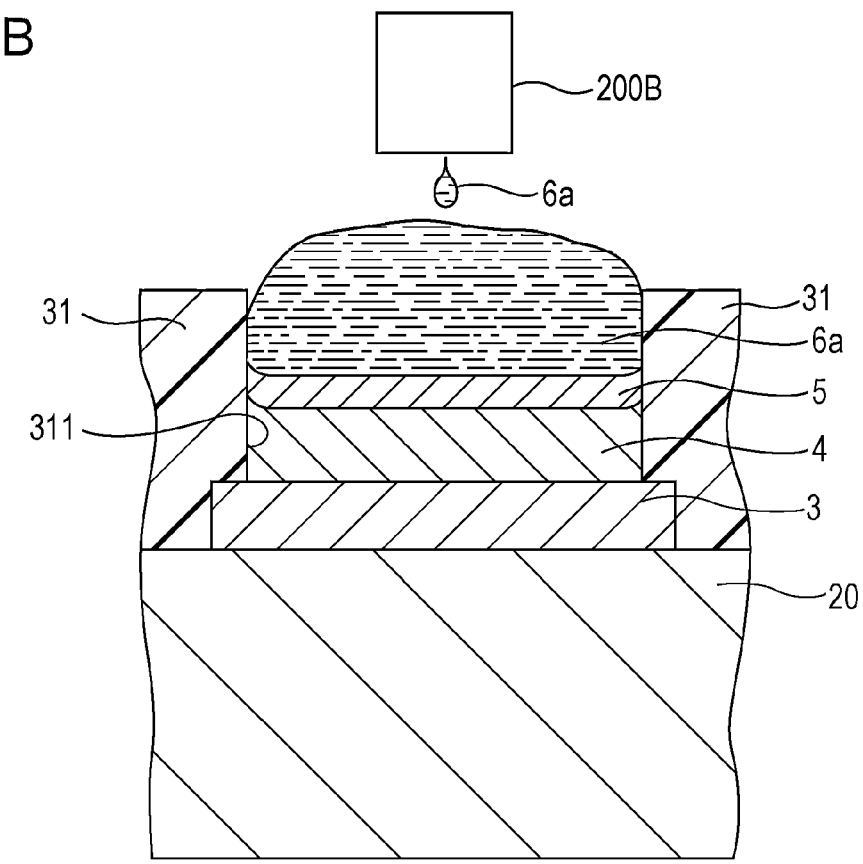

Next, as shown in FIG. 6B, an ink 6*a* (liquid) for light-emitting layer formation is applied on the hole transporting layer 5 inside the dividing wall 31 from an ink jet head 200B.

The thickness of the outer peripheral portion of the hole transporting layer 5 formed in the dividing wall 31 easily becomes thicker than the central portion, and the thickness of the outer peripheral portion of the light-emitting layer 6 formed thereafter in the dividing wall 31 also easily becomes thicker than the central portion. Because the substantial thickness of the light-emitting layer 6 is influenced by the shape of the surface of the light-emitting layer 6 side of the hole transporting layer 5, the outer peripheral portion of the light-emitting layer 6 is curved and the thickness of the outer peripheral portion becomes thicker than the central portion even if the thickness of the light-emitting layer 6 is simply made uniform.

In this step, the surface on the opposite side to the hole transporting layer 5 of the light-emitting layer 6 is formed so as to have the same shape as the surface on the light-emitting layer 6 side of the hole transporting layer 5. In so doing, it is possible for the substantial film thickness of the light-emitting layer 6 to be made uniform. In so doing, it is possible for the characteristics of the light-emitting element 1 to be increased.

Specifically, in this step, the contact angle of the ink 6*a* with respect to the hole transporting layer 5 is made the same as or smaller than the contact angle of the ink 6*a* with respect to dividing wall 31. In so doing, it is possible for the thickness of the outer peripheral portion of the light-emitting layer 6 becoming thicker than the central portion to be reduced. As a result, in a case in which the thickness of the outer peripheral portion of the hole transporting layer 5 becomes thicker than the central portion, it is possible for the substantial film thickness of the light-emitting layer 6 to be made uniform. For example, by selecting the constituent materials of the hole transporting layer 5 or the type of solvent (dispersion medium), as appropriate, it is possible for the relationship of the contact angles described above to be obtained.

The ink 6*a* has the constituent material of the light-emitting layer 6 or a precursor thereof dissolved in a solvent or dispersed in a dispersion medium. Examples of the solvent or dispersion medium include various inorganic solvents, various organic solvent, or a mixed solvent including these.

Figure 7A:
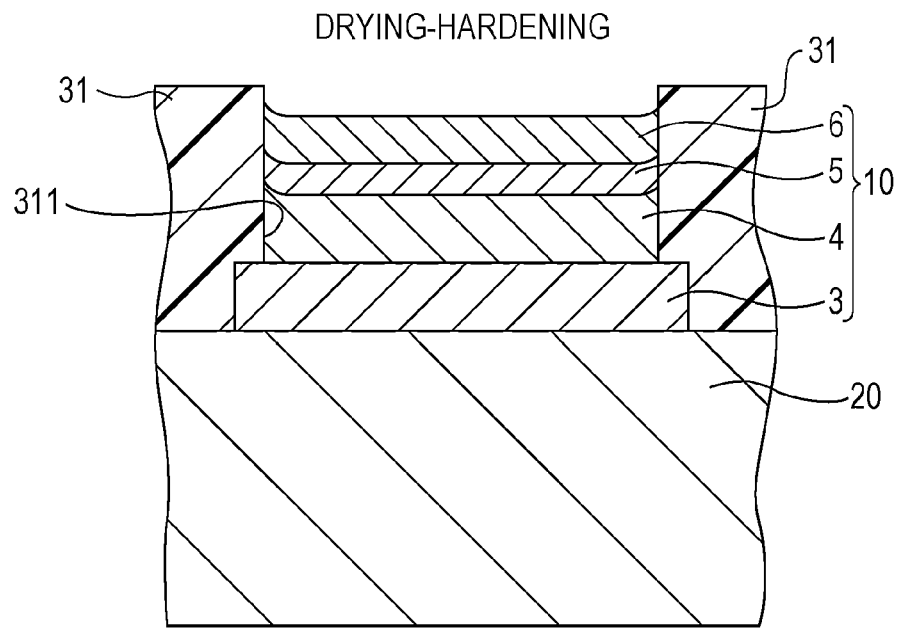
FIGS. 7A and 7B are diagrams for illustrating the method of manufacturing a light-emitting element shown in FIG. 2A.
Figure 7B:
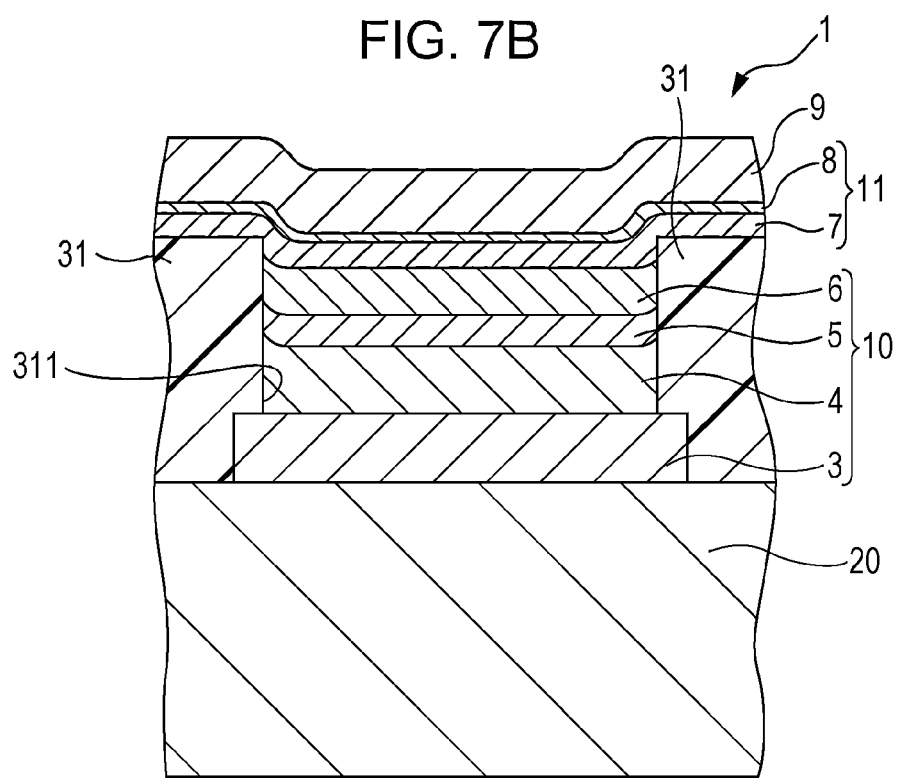

Thereafter, light-emitting layer 6 is formed, as shown in FIG. 7A, by drying (removing the solvent or removing the dispersion medium) the ink 6*a* on the hole transporting layer 5 and performing heat treatment, as necessary.

It is possible to perform the drying by leaving to stand at atmospheric pressure or reduced atmospheric pressure, by a heating process, by the spraying of inert gas, or the like.

When the area in plan view of the dividing wall 31 is A[μm$^2$] and the amount of ink 6a applied on the hole transporting layer 5 when the light-emitting layer 6 is formed is B[ng], it is preferable that B/A be 0.003 ng/μm$^2$ or more and 0.006 ng/μm$^2$ or less, 0.003 ng/μm$^2$ or more and 0.005 ng/μm$^2$ or less is more preferable, and 0.004 ng/μm$^2$ or more and 0.005 ng/μm$^2$ or less is still more preferable. In so doing, it is possible for the thickness of the outer peripheral portion of the light-emitting layer 6 becoming thicker than the central portion to be effectively reduced.

It is preferable that drying be performed by reducing pressure from normal pressure to 5 Pa within 5 minutes after applying the ink 6a on the hole transporting layer 5. In so doing, it is possible for the thickness of the outer peripheral portion of the light-emitting layer 6 becoming thicker than the central portion to be reduced.

As above, the light-emitting layer 6 is formed with a liquid phase process using the ink 6a.

[5]

Next, the electron transporting layer 7, the electron injection layer 8, and the cathode 9 are formed in this order on the light-emitting layer 6. In so doing, the light-emitting element 1 is obtained.

It is possible to form each of the electron transporting layer 7, the electron injection layer 8, and cathode 9 by a vapor phase process using a dry plating method or the like, such as a vacuum deposition. The electron transporting layer 7, the electron injection layer 8, and the cathode 9 are each preferably formed using a liquid phase process.

Through the steps described above, the light-emitting element 1 is obtained.

Electronic Apparatus

Figure 8:
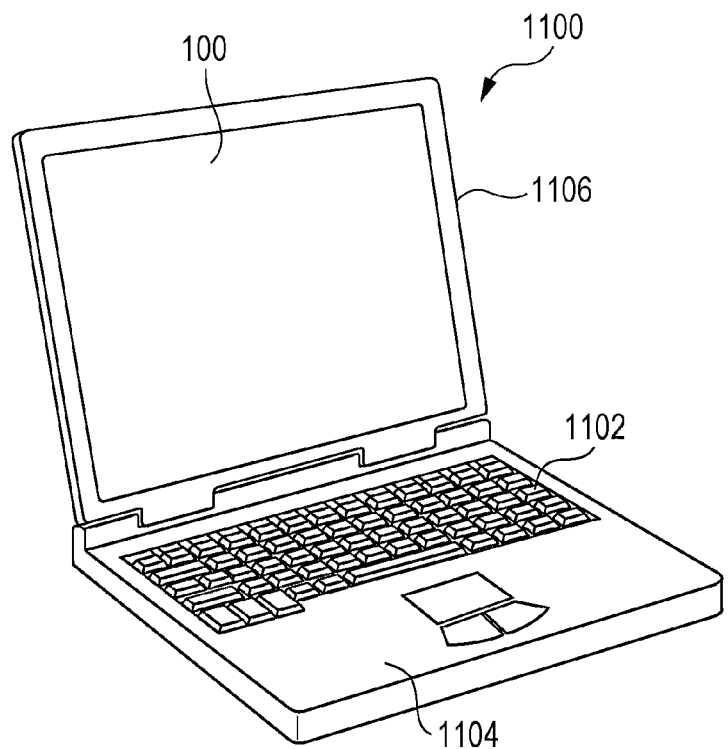
FIG. 8 is a perspective view showing a configuration of a mobile type (or a notebook type) personal computer that is an example of the electronic apparatus of the invention.

FIG. 8 is a perspective view showing a configuration of a mobile type (or a notebook type) personal computer in which the electronic apparatus of the invention is applied.

In the drawing, a personal computer 1100 is configured by a main body portion 1104 provided with a keyboard 1102, and a display unit 1106 provided with a display portion, and the display unit 1106 is rotatably supported via a hinge structure unit with respect to the main body portion 1104.

In the personal computer 1100, a display portion provided with the display unit 1106 is configured by the above-described display device 100.

Figure 9:
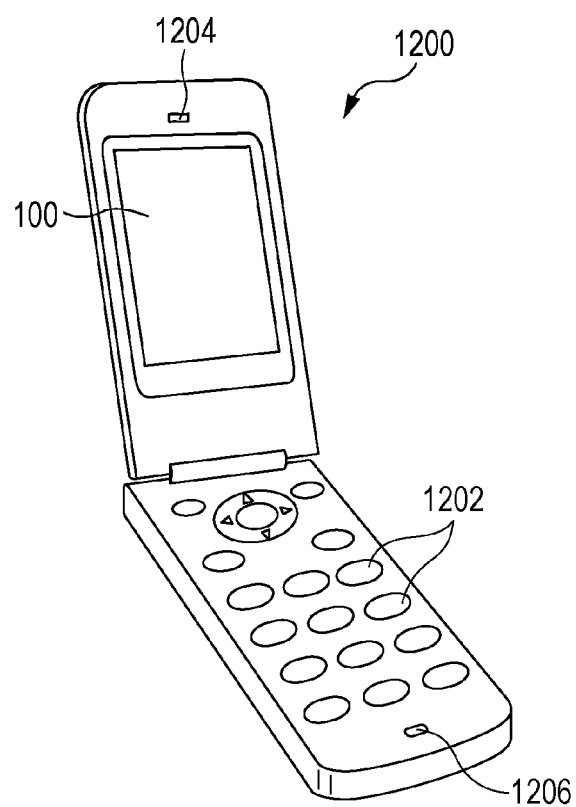
FIG. 9 is a perspective view showing the configuration of a mobile telephone device (including a PHS) that is an example of an electronic apparatus of the invention.

FIG. 9 is a perspective view showing the configuration of a portable telephone device (including a PHS) that is an example of an electronic apparatus of the invention.

In the drawing, the portable telephone device 1200 is provided with a plurality of operation buttons 1202, an earpiece 1204, and a mouthpiece 1206, along with a display portion.

In the portable telephone device 1200, the display portion is configured by the above-described display device 100.

Figure 10:
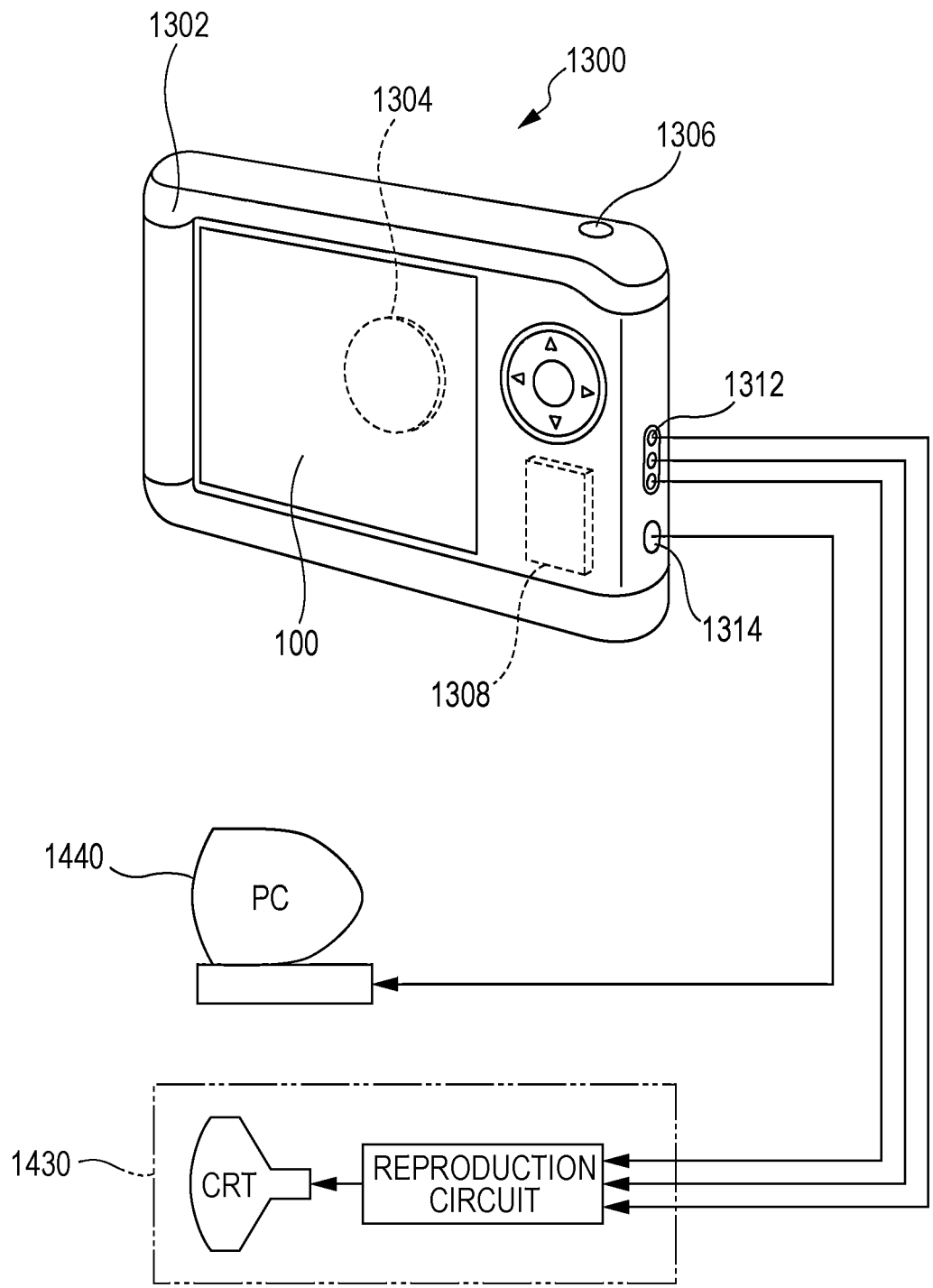
FIG. 10 is a perspective view showing a configuration of a digital still camera that is an example of the electronic apparatus of the invention.

FIG. 10 is a perspective view showing a configuration of a digital still camera to which the electronic apparatus of the invention is applied. In the drawings, the connection with the external apparatus is shown simplified.

In contrast to an ordinary camera in which a silver chloride photographic film receives light by imaging a subject, a digital still camera 1300 images a subject and generates an imaging signal (image signal) by photoelectric conversion with an imaging element such as a coupled charge device (CCD).

A display portion is provided on the rear surface of the case (body) 1302 of the digital still camera 1300, is configured to perform display based on the imaging signal by the CCD, and functions as a viewfinder that displays a subject as an electronic image.

In the digital still camera 1300, the display portion is configured by the above-described display device 100.

A circuit substrate 1308 is arranged in the interior of the case. A memory able to accommodate (store) imaging signals is installed circuit substrate 1308.

On the front surface side (in the configuration in the drawing, rear surface side) of the case 1302, a light receiving unit 1304 that includes an optical lens (imaging optical system), CCD or the like is provided.

The photographer verifies the subject image displayed on the display portion, and when the shutter button 1306 is depressed, the imaging signal of the CCD at this point in time is transferred to and stored in the memory of the circuit substrate 1308.

In the digital still camera 1300, a video signal output terminal 1312 and an input-output terminal 1314 for data communication are provided on the side surface of the case 1302. As shown in the drawings, a television monitor 1430 and a personal computer 1440 are connected, as necessary, to the video signal output terminal 1312 and to the input-output terminal 1314 for data communication, respectively. The imaging signal stored in the memory of the circuit substrate 1308 is output to the television monitor 1430 or the personal computer 1440 with a predetermined operation.

The electronic apparatus of the invention has excellent reliability.

Here, in addition to the personal computer of FIG. 8 (mobile type personal computer), the portable telephone devices in FIG. 9, digital still cameras in FIG. 10, the electronic apparatus according to the invention is capable of being applied to televisions, video cameras, viewfinder type and monitor direct-view type video tape recorders, laptop personal computers, car navigation systems, pagers, electronic organizers (including those with communication function), electronic dictionaries, calculators, electronic game machines, word processors, workstations, videophones, television monitors for security, electronic binoculars, POS terminals, apparatuses provided with a touch screen (for example, cash dispensers of financial institutions, automatic ticket vending machines), medical equipment (for example, electronic thermometers, blood pressure monitors, blood glucose meters, ECG display devices, ultrasonic diagnostic devices, and endoscopic display devices), fishfinders, various measurement apparatuses, meters, (for example, instruments for vehicles, aircraft, and ships), flight simulators, various other monitors, projection-type display devices such as projectors, and the like.

Above, although the light-emitting element, method of manufacturing a light-emitting element, light-emitting device, and electronic apparatus according to an aspect of the invention were described based on the embodiments shown in the drawings, the invention is not limited thereto.

For example, in the embodiment described above, although the light-emitting element includes one light-emitting layer, two or more light-emitting layers are preferably included. The light emission color of the light-emitting layer is not limited to the R, G, and B of the above-described embodiment.

EXAMPLES

Next, specific examples the invention will be described.
1. Method of Manufacturing Light-Emitting Element

Example 1

(1) First, a transparent glass substrate with an average thickness of 0.5 mm was prepared. Next, an ITO electrode (anode) with an average thickness of 100 nm was formed on the substrate using a sputtering method. After the insulating layer formed with an acrylic resin was formed, the dividing wall (bank) was formed by patterning the insulating layer so as to expose the ITO electrode using a photolithography method. The shape of the dividing wall in plan view was a long shape with a length of 300 µm and a width of 100 µm, and the height of the dividing wall was 2 p.m.

After the substrate was immersed in acetone and 2-propanol, in this order, and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70° C. to 90° C.

(2) Next, after the ink for hole injection layer formation was applied on the ITO electrode by filling in the dividing wall with an ink jet method, the hole injection layer with an average height of 50 nm was formed by heat treatment (firing) after reduced pressure drying thereof.

Here, a PEDOT:PSS dispersion solution (ink concentration: 1.0 wt %) was used as the ink for hole injection layer formation. Firing was performed under atmospheric pressure, at a firing temperature of 200° C., and a firing time of 10 minutes.

(3) Next, after the ink for hole transporting layer formation was applied on the hole injection layer by filling in the dividing wall with an ink jet method, the hole transporting layer with an average height of 30 nm was formed by heat treatment (firing) after reduced pressure drying thereof.

A solution (ink concentration: 0.45 wt %) in which 0.45 g of a compound A that is an aryl-amine polymer is dissolved in 100 g of 3-phenoxytoluene was used as the ink for hole transporting layer formation. Firing was performed in a glove box filled with nitrogen, at a firing temperature of 180° C. and a firing time of 30 minutes.

Figure 11A:
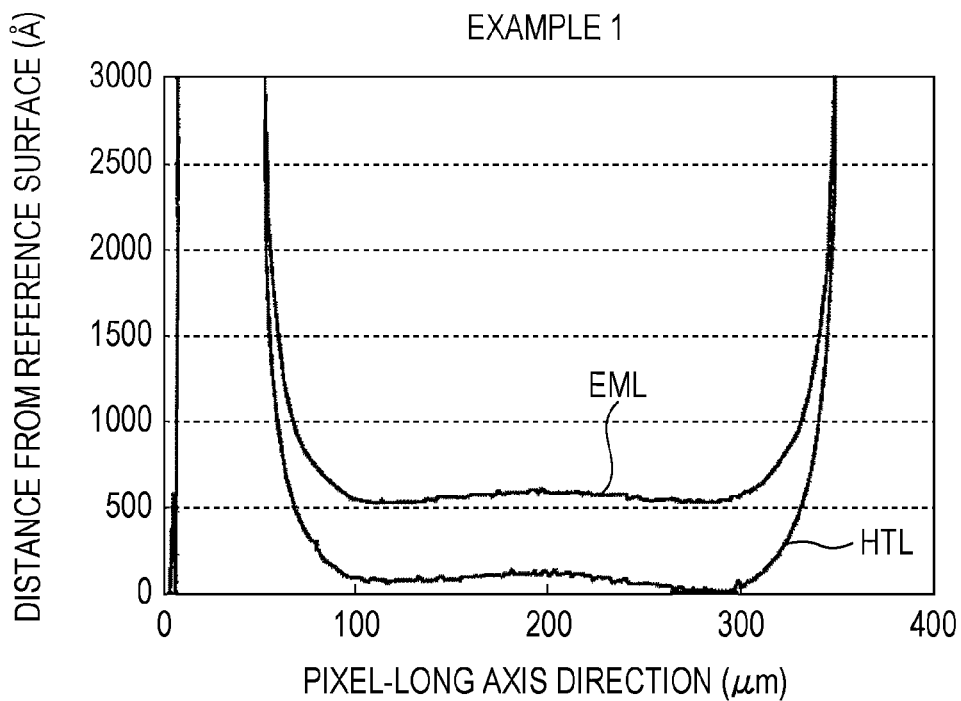
FIG. 11A is a graph showing the shape of the light-emitting layer of the light-emitting element according to Example 1 of the invention.

After formation of the hole transporting layer, the shape of the surface of the hole transporting layer was measured with a contact-type surface measurement device. The measurement results are shown in FIG. 11A (HTL in the drawing).

(4) Next, after the ink for light-emitting layer formation was applied on the hole transporting layer by filling in the dividing wall with an ink jet method, the light-emitting layer with an average height of 20 nm was formed by heat treatment (firing) after reduced pressure drying thereof.

A tetralone solution (concentration 1 wt %) in which CBP (4,4'-bis(9-dicarbazoyl)-2,2'-biphenyl), Ir(ppy)3(Fac-tris(2-phenylpridene) iridium) are mixed at a mass ratio of 90:10 was used as the ink for light-emitting layer formation. Application of the ink for light-emitting layer formation was performed in 16 shots at 10 ng per shot, and the filling amount was 160 ng. Drying was carried out directly after application of the ink for light-emitting layer formation by reducing pressure over five minutes from normal pressure to 5 Pa. Firing was performed in a glove box filled with nitrogen, at a firing temperature of 100° C. and a firing time of 20 minutes.

Figure 11B:
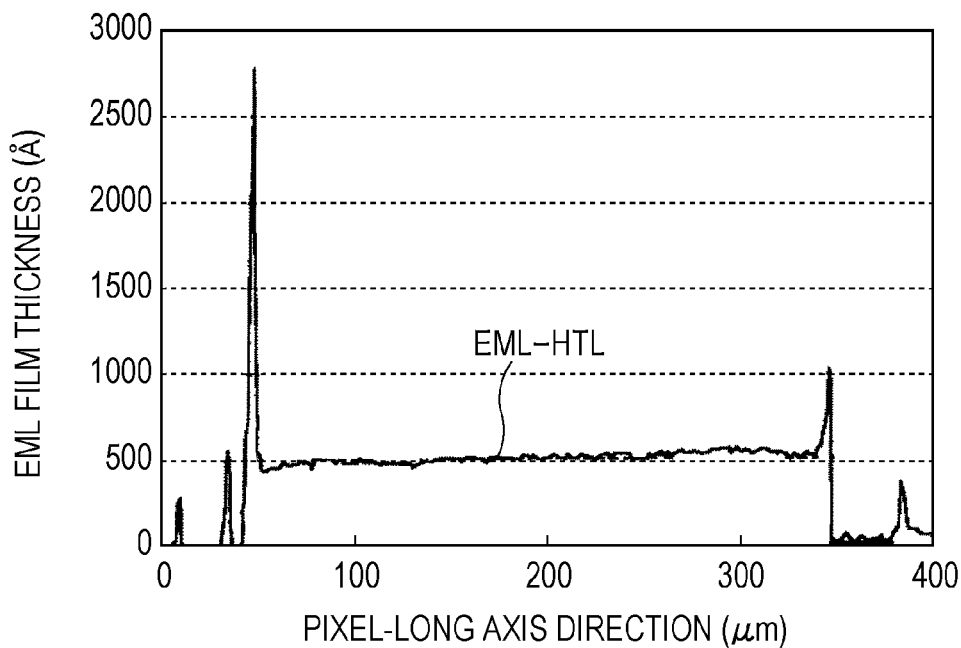
FIG. 11B is a graph showing the film thickness distribution of the light-emitting layer.

After formation of the light-emitting layer, the shape of the surface of the light-emitting layer was measured with a contact-type surface measurement device. The measurement results are shown in FIG. 11A (EML in the drawing). The results of the difference between the surface shape of the hole transporting layer and the surface shape of the light-emitting layer are shown in FIG. 11B.

(5) Next, an $Alg_a$ film was formed on the light-emitting layer with a vacuum deposition method, thereby forming an electron transporting layer with an average thickness of 20 nm.

(6) Next, an electron injection layer with an average thickness of 0.5 nm was formed on the electron transporting layer by forming a film with lithium fluoride (LiF) using the vacuum deposition method.

(7) Next, an Al film was formed on the electron injection layer using the vacuum deposition method. In so doing, a cathode with average thickness of 150 nm and configured of Al, was formed.

Through the above steps, a light-emitting element was manufactured.

Comparative Example

Other than using the compound B that is an amine polymer containing fluorene as the ink for hole transporting layer formation, the light-emitting element was manufactured similarly to the above-described Example 1.

Figure 12A:
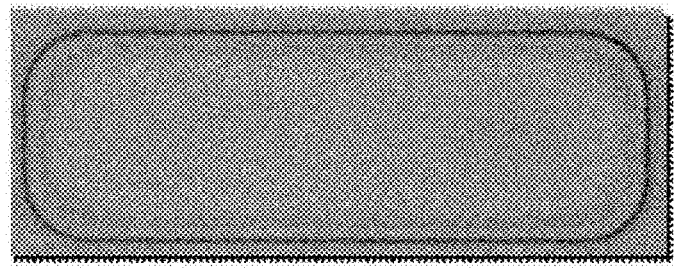
FIGS. 12A to 12C are photographs showing a state in the bank in cross-sectional view.
Figure 12B:
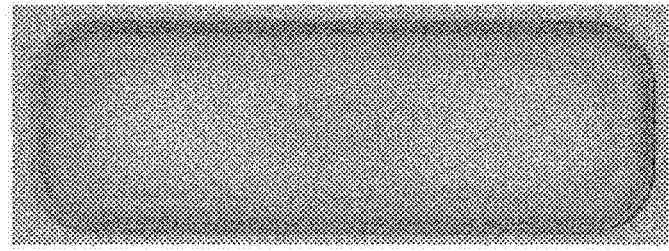
Figure 12C:
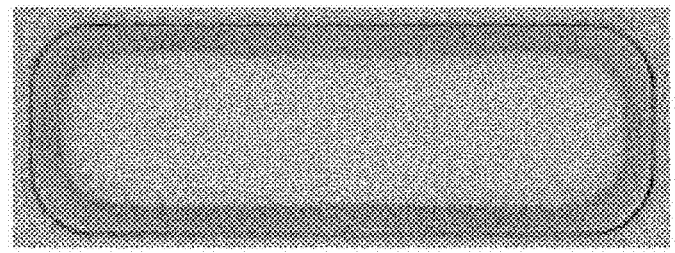

The state of the ink for light-emitting layer formation dropped on the hole transporting layer is shown in FIG. 12C. FIGS. 12A to 12C are photographs showing the state in the bank in cross-sectional view. FIG. 12A shows a state after forming the hole injection layer and before forming the hole transporting layer in the bank in cross-sectional view, FIG. 12B shows a state after dropping the ink for light-emitting layer formation of Example 1, and FIG. 12C shows a state after dropping the ink for light-emitting layer formation of a comparative example.

As shown in FIGS. 12A to 12C, in the comparative example, the method of wetting and spreading of the ink for light-emitting layer formation is different to Example 1. Specifically, in contrast to ink being seen remaining in the vicinity of the center of the pixel in Example 1, it is understood that ink spreads along the bank in the comparative example. This is because, in the comparative example, the wettability of the ink for light-emitting layer formation with respect to the hole transporting layer formed using the compound B is lowered compared to the bank, whereas, in Example 1, the wettability of the ink for light-emitting layer formation with respect to the hole transporting layer formed using the compound A is the same or higher as the bank.

Figure 13A:
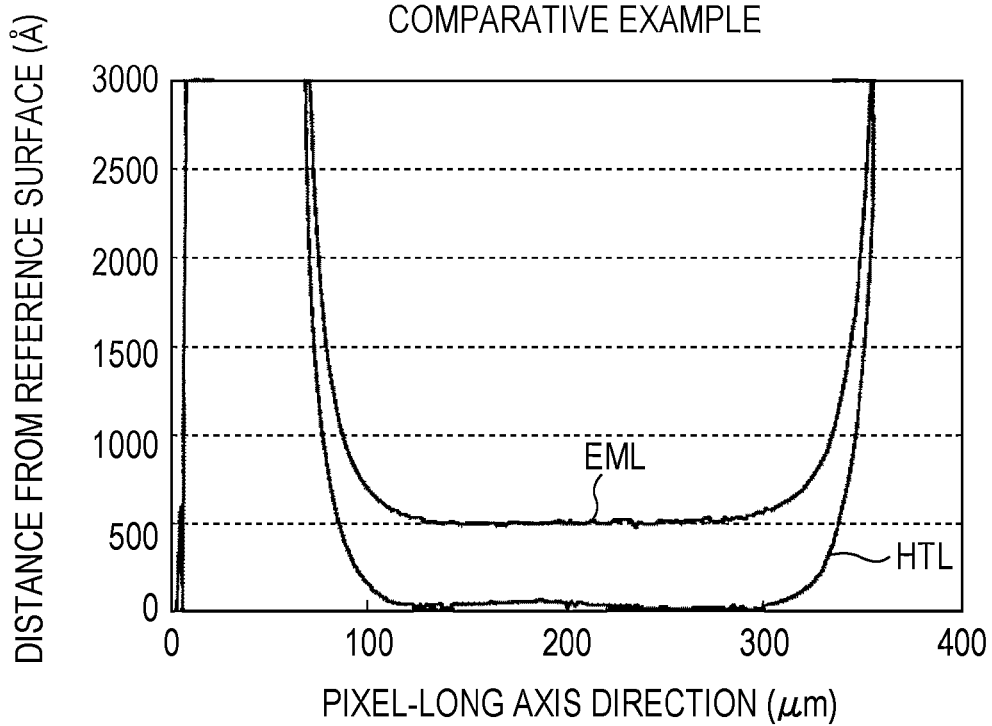
FIG. 13A is a graph showing the shape of the light-emitting layer of the light-emitting element according to a comparative example.
Figure 13B:
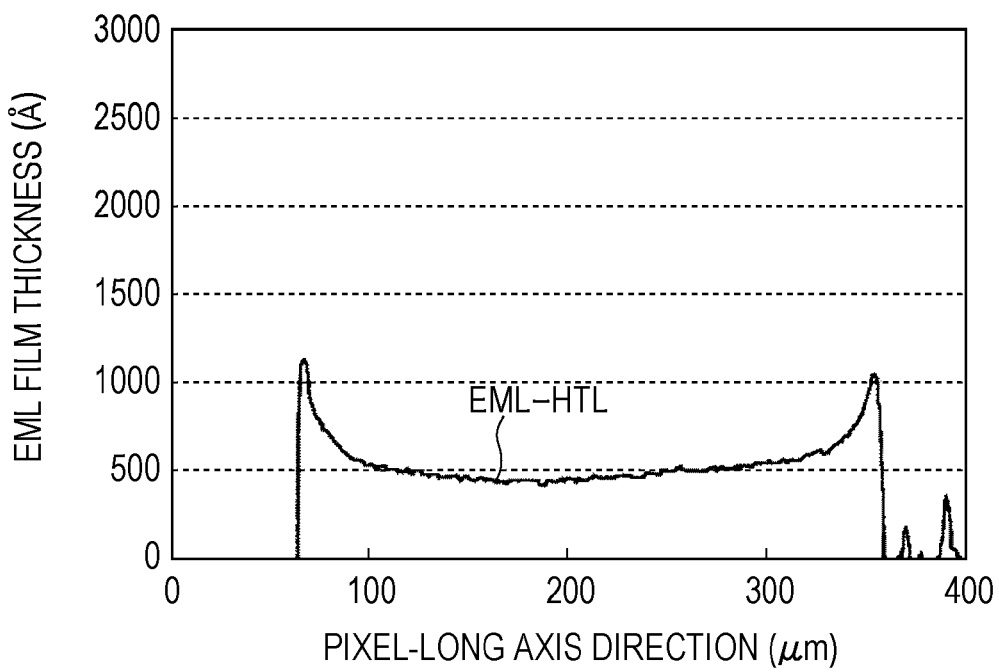
FIG. 13B is a graph showing the film thickness distribution of the light-emitting layer.

The results of the surface shape of the hole transporting layer and the surface shape of the light-emitting layer measured similarly to Example 1 are shown in FIG. 13A. The results of the difference between the surface shape of the hole transporting layer and the surface shape of the light-emitting layer are shown in FIG. 13B.

Example 2

Other than application of the ink for light-emitting layer formation being carried out in 12 shots for a filling amount of 120 ng, the light-emitting element was manufactured similarly to the above-described Example 1.

Reference Example 1

Other than application of the ink for light-emitting layer formation being carried out in 20 shots for a filling amount of 200 ng, the light-emitting element was manufactured similarly to the above-described Example 1.

Reference Example 2

Other than application of the ink for light-emitting layer formation being carried out in 24 shots for a filling amount of 240 ng, the light-emitting element was manufactured similarly to the above-described Example 1.

Example 3

Other than drying being performed directly after application of the ink for light-emitting layer formation being by reducing the pressure from normal pressure to 5 Pa over one minute, the light-emitting element was manufactured similarly to the above-described Example 1.

Reference Example 3

Other than drying being performed directly after application of the ink for light-emitting layer formation being by reducing the pressure from normal pressure to 5 Pa over 12 minutes, the light-emitting element was manufactured similarly to the above-described Example 1.

Example 4

Other than application of the ink for light-emitting layer formation being carried out in 12 shots for a filling amount of 120 ng, and drying being performed directly after application of the ink for light-emitting layer formation being by reducing the pressure from normal pressure to 5 Pa over one minute, the light-emitting element was manufactured similarly to the above-described Example 1.

Reference Example 4

Other than application of the ink for light-emitting layer formation being carried out in 20 shots for a filling amount of 200 ng, and drying being performed directly after application of the ink for light-emitting layer formation being by reducing the pressure from normal pressure to 5 Pa over 12 minutes, the light-emitting element was manufactured similarly to the above-described Example 1.

Reference Example 5

Other than application of the ink for light-emitting layer formation being carried out in 20 shots for a filling amount of 200 ng, and drying being performed directly after application of the ink for light-emitting layer formation being by reducing the pressure from normal pressure to 5 Pa over one minute, the light-emitting element was manufactured similarly to the above-described Example 1.

Reference Example 6

Other than application of the ink for light-emitting layer formation being carried out in 24 shots for a filling amount of 240 ng, and drying being performed directly after application of the ink for light-emitting layer formation being by reducing the pressure from normal pressure to 5 Pa over one minute, the light-emitting element was manufactured similarly to the above-described Example 1.

2. Evaluation

The brightness distribution was measured by emitting light from each light-emitting element manufactured as described above, and the results shown in FIGS. 14A to 16 were obtained.

Figure 14A:
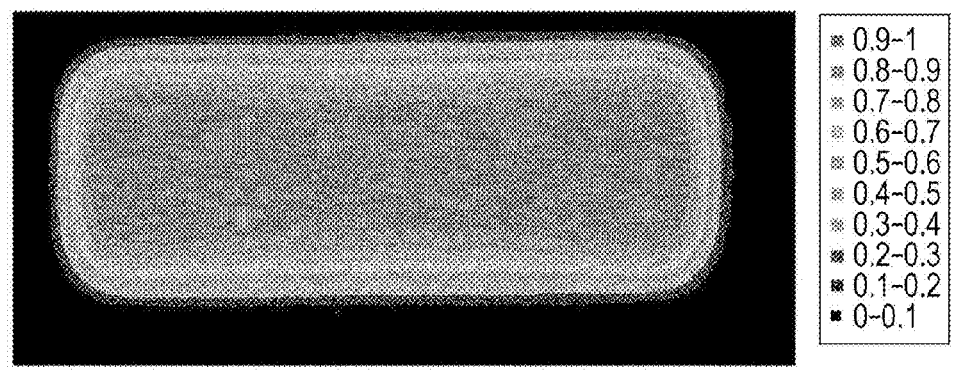
FIG. 14A is a drawing showing the light emission state of the light-emitting layer of the light-emitting element according to Example 1 of the invention.
Figure 14B:
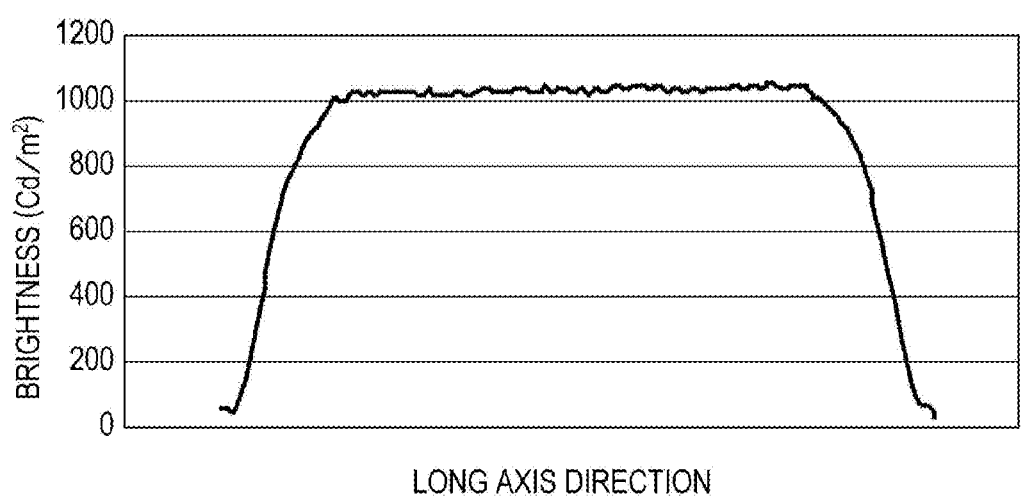
FIG. 14B is a graph showing the film thickness distribution of the light-emitting layer.
Figure 15A:
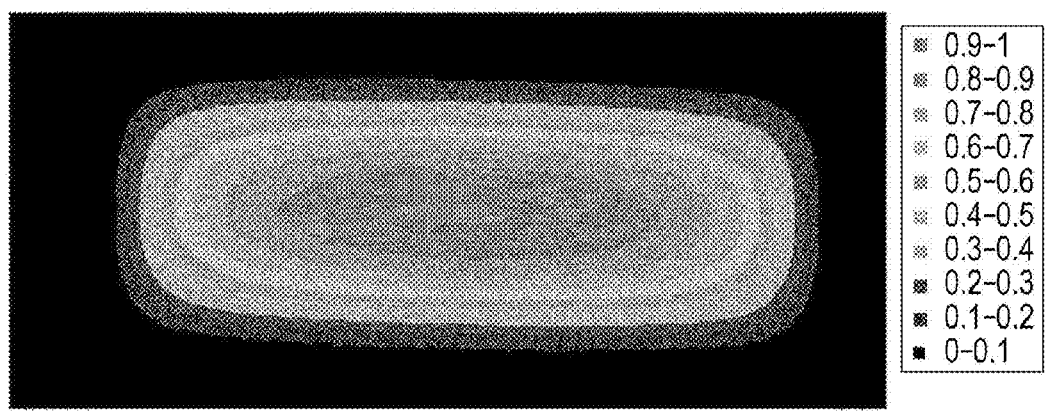
FIG. 15A is a drawing showing the light emission state of the light-emitting layer of the light-emitting element according to a comparative example.
Figure 15B:
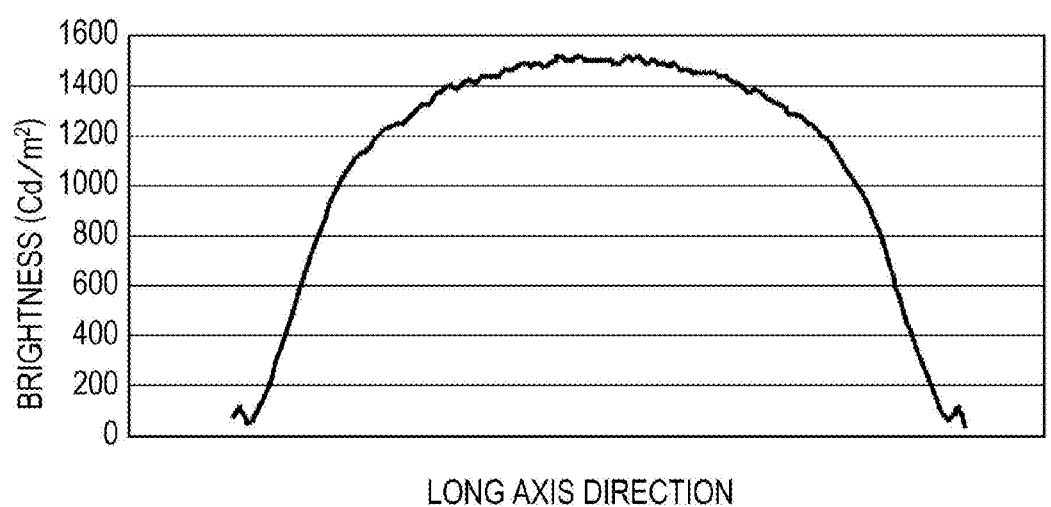
FIG. 15B is a graph showing the film thickness distribution of the light-emitting layer.
Figure 16:
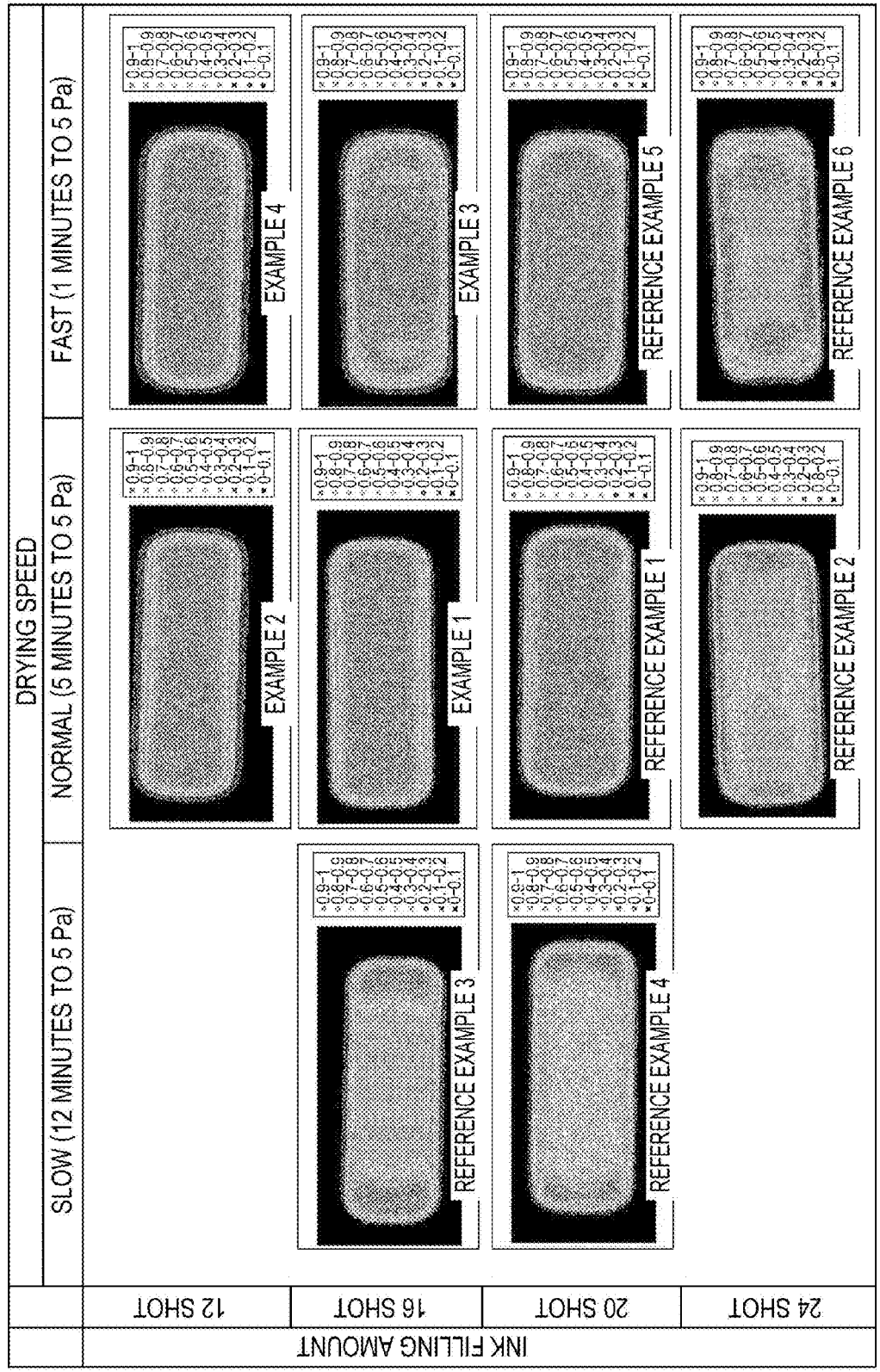
FIG. 16 is a diagram showing the light emission state of the light-emitting layer of the light-emitting element according to the examples and reference examples of the invention.

FIG. 14A is drawing showing the light emission state of the light-emitting layer of the light-emitting element according to Example 1 of the invention, and FIG. 14B is a graph showing the film thickness distribution of the light-emitting layer. FIG. 15A is a drawing showing the light emission state of the light-emitting layer of the light-emitting element according to the comparative example, and FIG. 15B is a graph showing the film thickness distribution of the light-emitting layer. FIG. 16 is a diagram showing the light emission state of the light-emitting layer of the light-emitting element according to the examples and reference examples of the invention.

As is seen in the drawings, the light-emitting element of each example has a more uniform brightness distribution compared to the light-emitting elements of the comparative example and each reference example. In contrast to the brightness distribution being uniformized because the substantial film thickness of the light-emitting layer is uniform (refer to FIG. 11B) in the light-emitting element of each example. It is observed that the brightness distribution is non-uniform because the substantial film thickness of the light-emitting layer is not uniform (refer to FIG. 13B) in the light-emitting element of the comparative example and each reference example.

In addition to the wettability of the hole transporting layer with respect to the ink for light-emitting layer formation being the same or higher as the dividing wall during formation of the light-emitting layer, spreading of the ink is suppressed by suppressing the filling amount of the ink or increasing the drying speed after ink application, and, as a result, it was observed that uniformizing of the substantial film thickness of the light-emitting layer in the light-emitting element of each example is achieved. In contrast, by increasing the filling amount of ink or slowing the drying speed after ink application during formation of the light-emitting layer, the ink easily spreads, and, as a result, it is observed that the substantial film thickness of the light-emitting layer in the light-emitting element of each reference example becomes non-uniform.

The entire disclosure of Japanese Patent Application No. 2014-067151, filed Mar. 27, 2014 is expressly incorporated by reference herein.

What is claimed is:
1. A light-emitting element, comprising:
a first electrode;
a second electrode;
a first layer provided between the first electrode and the second electrode;
a second layer provided in contact with the first layer between the first layer and the second electrode;
a reference surface of the first electrode that faces the first layer;
a first surface of the first layer that is in contact with the second layer, the first surface being formed having a part in which a distance between the first surface and the reference surface changes in a continuous or stepwise manner; and
a second surface of the second layer disposed on an opposite side of the second layer from the first layer, the second surface being formed so as to have a same shape as the first surface,
wherein in a first region covering at least 90% of the second layer in a width direction of the second layer, a difference between the distance between the first surface and the reference surface and a distance between the second surface and the reference surface is within a range of ±10% with respect to an average value of the difference within the first region.

2. The light-emitting element according to claim 1,
wherein the second layer has a long shape when viewed in a direction in which the first electrode and the second electrode overlap, and
in a second region covering at least 90% of the second layer in a length direction of the second layer, a difference between the distance between the first surface and the reference surface and the distance between the second surface and the reference surface is within a range of ±10% with respect to an average value of the difference within the second region.

3. A light-emitting device comprising the light-emitting element according to claim 2.

4. An electronic apparatus comprising the light-emitting element according to claim 2.

5. The light-emitting element according to claim 1,
wherein the first electrode is an anode,
the second electrode is a cathode,
the first layer is a hole injection layer or a hole transporting layer; and
the second layer is a light-emitting layer.

6. A light-emitting device comprising the light-emitting element according to claim 5.

7. An electronic apparatus comprising the light-emitting element according to claim 5.

8. A light-emitting device comprising the light-emitting element according to claim 1.

9. An electronic apparatus comprising the light-emitting element according to claim 1.

10. A method of manufacturing the light-emitting element according to claim 1, comprising:
forming the first electrode;
forming the first layer using a liquid phase process on the reference surface of the first electrode;
forming the second layer using a liquid phase process on the first layer such that the second surface has the same shape as the first surface; and
forming a the second electrode on the opposite side of the second layer from the first layer.

11. The method of manufacturing the light-emitting element according to claim 10,
wherein the first layer and the second layer are formed in a same divided bank.

12. The method of manufacturing the light-emitting element according to claim 11,
wherein the forming of the second layer is performed by fixing after applying a liquid including a material that configures the second layer or a precursor thereof on the first layer; and
in the forming of the second layer, a contact angle of the precursor with respect to the first layer is equal to or smaller than a contact angle of the precursor with respect to the bank.

13. The method of manufacturing the light-emitting element according to claim 12,
wherein B/A is 0.003 ng/$\mu m^2$ or more and 0.006 ng/$\mu m^2$ or less when an area in plan view in the bank is A [$\mu m^2$] and an amount of liquid applied on the first layer when forming the second layer is B[ng].

14. The method of manufacturing the light-emitting element according to claim 12,
wherein drying is performed by reducing pressure from normal pressure to 5 Pa within 5 minutes after applying the precursor on the first layer.

\* \* \* \* \*